US012193195B2

(12) United States Patent
Koerner et al.

(10) Patent No.: US 12,193,195 B2
(45) Date of Patent: Jan. 7, 2025

(54) UNINTERRUPTIBLE POWER AND COOLING FOR CRITICAL POWER APPLICATIONS

(71) Applicant: Caeli, LLC, Dallas, TX (US)

(72) Inventors: Matthew Douglas Koerner, Ashburn, VA (US); Brandon McDaniel, Flower Mound, TX (US); John A. Musilli, Jr., San Diego, CA (US)

(73) Assignee: Caeli, LLC, Dallas, TX (US)

( * ) Notice: Subject to any disclaimer, the term of this patent is extended or adjusted under 35 U.S.C. 154(b) by 447 days.

(21) Appl. No.: 17/450,272

(22) Filed: Oct. 7, 2021

(65) Prior Publication Data

US 2022/0117120 A1 Apr. 14, 2022

Related U.S. Application Data

(60) Provisional application No. 63/117,825, filed on Nov. 24, 2020, provisional application No. 63/089,467, filed on Oct. 8, 2020.

(51) Int. Cl.
*H05K 7/20* (2006.01)
*H02J 9/06* (2006.01)
(Continued)

(52) U.S. Cl.
CPC ......... *H05K 7/20818* (2013.01); *H02J 9/062* (2013.01); *H02J 15/006* (2013.01);
(Continued)

(58) Field of Classification Search
CPC ... G05B 2219/2619; G05B 2219/50333; H02J 15/006; H02J 2300/20; H02J 2310/16;
(Continued)

(56) References Cited

U.S. PATENT DOCUMENTS

| 6,255,743 | B1* | 7/2001 | Pinkerton | H02K 7/025 |
| | | | | 290/40 C |
| 6,463,738 | B1* | 10/2002 | Pinkerton | H02J 15/007 |
| | | | | 60/657 |

(Continued)

OTHER PUBLICATIONS

International Search Report and Written Opinion issued Jan. 19, 2022 regarding International Application No. PCT/US2021/071804, 7 pages.

(Continued)

*Primary Examiner* — Jesse S Bogue

(57) ABSTRACT

A system includes a metering device to receive first electrical energy from a power source and provide at least a portion of the first electrical energy to a data center during a first time period. The system also includes an electrical-to-mechanical energy conversion device to convert air to a compressed or liquified state using at least the portion of the first electrical energy. The system also includes a storage container to receive the air and store the air in the compressed or liquified state. The system also includes a mechanical-to-electrical energy conversion device to: receive the air from the storage container in a gaseous, compressed state; generate second electrical energy for powering the data center; and exhaust cooled air for providing to the data center to cool the electronic devices.

17 Claims, 11 Drawing Sheets

(51) Int. Cl.
*H02J 15/00* (2006.01)
*H02K 7/18* (2006.01)

(52) U.S. Cl.
CPC ....... *H02K 7/18* (2013.01); *G05B 2219/2619* (2013.01); *G05B 2219/50333* (2013.01)

(58) Field of Classification Search
CPC . H02J 3/381; H02J 9/062; H02K 7/18; H05K 7/1492; H05K 7/20818; Y02B 10/70
See application file for complete search history.

(56) References Cited

U.S. PATENT DOCUMENTS

| | | | | | |
|---|---|---|---|---|---|
| 7,127,895 | B2* | 10/2006 | Pinkerton | ................ | F02C 6/16 60/659 |
| 7,456,513 | B2* | 11/2008 | Meyers | ................ | F02C 1/04 62/259.2 |
| 8,671,686 | B2* | 3/2014 | Pinkerton | ................ | G06F 1/30 60/659 |
| 11,314,304 | B2* | 4/2022 | Shaikh | ................ | G05B 13/048 |
| 11,591,957 | B2* | 2/2023 | Howitt | ................ | F02C 6/16 |
| 11,744,047 | B2* | 8/2023 | Koerner | ................ | H05K 7/1498 361/688 |
| 2005/0099770 | A1 | 5/2005 | Fink | | |
| 2006/0059937 | A1* | 3/2006 | Perkins | ................ | F02C 7/18 62/401 |
| 2011/0094242 | A1* | 4/2011 | Koerner | ................ | H02J 15/008 60/780 |
| 2011/0154842 | A1* | 6/2011 | Heydari | ................ | H05K 7/20836 165/104.33 |
| 2011/0167814 | A1* | 7/2011 | Haynes | ................ | F01K 27/00 60/517 |
| 2011/0227344 | A1 | 9/2011 | Hatton et al. | | |
| 2011/0239683 | A1 | 10/2011 | Czamara et al. | | |
| 2017/0138674 | A1* | 5/2017 | Pourima | ................ | F02C 6/16 |
| 2021/0363899 | A1* | 11/2021 | Moser | ................ | F01K 13/00 |
| 2022/0390966 | A1* | 12/2022 | Koerner | ................ | G01K 3/08 |
| 2023/0110494 | A1* | 4/2023 | Lewis | ................ | F17C 5/06 60/659 |

OTHER PUBLICATIONS

MAN Energy Solutions, Urban Energy, https://www.man-es.com/docs/default-source/energy-storage/man-es_12-broch_urban-energy_preview.pdf?sfvrsn=e9be4f6d_18, 86224 Augsburg, Germany. 32 pgs.
Highview Power, "Cyrogenic energy storage", copyright 2021, 5 pgs. https://highviewpower.com/technology/.
Linde Engineering, "Modular CO2 purification and liquefaction plants", copyright 2021, 4 pgs., https://www.linde-engineering.com/en/process-plants/co2-plants/co2-purification-and-liquefaction/modular-co2-plants/index.html.
Energy Storage Association, "Mechanical Energy Storage", copyright 2021, 5 pgs., https://energystorage.org/why-energy-storage/technologies/mechanical-energy-storage/#:~:text=Compressed%20Air%20Energy%20Storage%20(CAES, demand%20(peak%20load)%20periods.
IEM Power Systems, "About IEM Power Systems", copyright 2017, 3 pgs., https://www.iemps.com/company/about-iem-power-systems.
Scribd, "Turbo Expanders for Cold Production and Energy Recovery Booklet PDF", copyright 2016, 17 pgs., https://www.scribd.com/document/452458382/Turbo-Expanders-for-cold-production-and-energy-recovery-booklet-pdf.
Hepbum, et al., "The technological and economic prospects for CO2 utilization and removal", https://www.nature.com/articles/s41586-019-1681-6#Tab2, Nov. 6, 2019, 11 pgs.
Scribd, "HITECH PowerPRO2-2016", copyright 2016, 55 pgs., https://www.scribd.com/document/347266893/HITEC-PowerPRO2700-2016-pdf.
Sciencedirect, "Sustainable hyrdocarbon fuels by recycling CO2 and H2O with renewable or nuclear energy", copyright 2010, 3 pgs., https://www.sciencedirect.com/science/article/abs/pii/S1364032110001942?via%3Dihub.
ScienceDirect, "Production of cement-free construction blocks from industry wastes", copyright 2016, 3 pgs., https://www.sciencedirect.com/science/article/abs/pii/S0959652616311374.
Blue Planet Systems, "Permanent Carbon Capture", copyright 2021, 4 pgs., http://www.blueplanet-ltd.com/#technology.
Carbon Cure "Sustainability in Concrete Makes Good Business Sense", copyright 2021, 9 pgs., https://www.carboncure.com/concrete producers/.
Solidia, "Solidia Solutions", copyright 2021, 1 pg., https://www.solidiatech.com/solutions.html.
Calix Global, "Cement & lime", copyright 2021, 3 pgs., https://www.calix.global/industries/cement-and-lime/.
Vox, "These uses of CO2 could cut emissions—and make trillions of dollars", copyright 2019, 18 pgs., https://www.vox.com/energy-and-environment/2019/11/13/20839531/climate-change-industry-co2-carbon-capture-utilization-storage-ccu.
Forbes, "Carbon Engineering—Taking CO2 Right Out of the Air to Make Gasoline", copyright 2019, 6 pgs., https://www.forbes.com/sites/jamesconca/2019/10/08/carbon-engineering-taking-co2-right-out-of-the-air-to-make-gasoline/?sh=370a22c813cc.
Department of Energy, "2021 Climate Adaptation and Resilience Plan", copyright 2021, 7 pgs., https://www.energy.gov.
Chart, "Bulk Storage Tanks", copyright 2021, 11 pgs., https://www.chartindustries.com/Products/Bulk-Cryogenic-Tanks.
Universal Industrial Gases, "Large Tank Specifications", copyright 2003, 2 pgs., http://www.uigi.com/largetanks.html.
Integ Systems Corporation, Brochure, copyright 2021, 4 pgs., https://www.integsystemscorp.com/pdf/Integ_Systems_Corp_Brochure.pdf.
Turbogaz, "Expander-Generator", copyright 2021, 5 pgs., https://turbogaz.com.ua/en/equipment/expander-generator.
Phoenix Equipment Corporation, "3.1 MW Steam Turbine Generator Set for Sale" 1 pg., https://www.phxequip.com/Multimedia/documents/plants/steam-turbine-generator-murray-3-1-mw-173.pdf.
Phoenix Equipment Corporation, "8 Steam Turbines & Steam Turbine Generators", copyright 2021, 7 pgs., https://www.phxequip.com/subcategory.222.0/power-generation-generators-steam-turbine-generators.aspx.
LNG Global, "WSCE Mini LNG Plants", copyright 2021, 5pgs., https://www.lngglobal.com/mini-lng-plant-overview.
MAN Energy Solutions, "MGT6000 Single Shaft", https://www.man-es.com/docs/default-source/oil-and-gas-process-industry-documents/mgt6000-1s-(single-shaft).pdf?sfvrsn=de156070_8, 86224 Augsburg, Germany, 4 pgs.
Science Based Targets, "Guidance for ICT Companies Setting Science Based Targets", https://sciencebasedtargets.org/resources/legacy/2020/04/GSMA_IP_SBT-report_WEB-SINGLE.pdf, 25 pgs.
PS&C Power, "Hybrid Rotary Uninterruptible Power Supply; Series XC", copyright 2021, 4 pgs., https://pscpower.com/large-hybrid-rotary-ups/.
SSS Gears Limited, "Power Generation", copyright 2021, 2 pgs., http://www.sssclutch.com/en/power-generation/.
Stirling Cryogenics, "Liquid Air Production Systems", copyright 2021, 4 pgs., https://www.stirlingcryogenics.eu/en/products/liquid-air-production-systems.
Calnetix Technologies, "Case Studies/The Heat to Power Solution" copyright 2021, 5 pgs., https://www.calnetix.com/system-integration/heat-power-systems.
Extended European Search Report issued Sep. 10, 2024 regarding Application No. 21878736.4, 8 pages.

* cited by examiner

UNINTERRUPTIBLE POWER AND COOLING FOR CRITICAL POWER APPLICATIONS

CROSS-REFERENCE TO RELATED APPLICATIONS AND PRIORITY CLAIM

This application claims priority under 35 U.S.C. § 119(e) to U.S. Provisional Patent Application No. 63/089,467 filed on Oct. 8, 2020, and U.S. Provisional Patent Application No. 63/117,825 filed on Nov. 24, 2020, both of which are hereby incorporated by reference in their entirety.

TECHNICAL FIELD

Embodiments of the present disclosure relate to a system for providing uninterruptible power and cooling from an intermittent power source for a critical power application, and a method for controlling the system thereof. Specifically, the system can be used to supply uninterruptible power and cooling to a data center using power generated by a renewable energy source.

BACKGROUND

Most forms of renewable energy produce intermittent power which, in the past, has been an unreliable source for powering critical applications that require uninterruptible power. For example, wind turbines are only able to provide power when the wind is blowing at a certain velocity. Similarly, solar panels are only able to produce power when the sun is shining.

Facilities that use power created by renewable sources are only able to use the power at times when the power is produced. Thus, facilities do not have a set power schedule on which they can depend since power production by renewable sources is largely unreliable.

SUMMARY

This disclosure provides systems and methods for providing uninterruptible power and cooling from an intermittent power source for a critical power application.

In a first embodiment, a system includes a metering device configured to receive first electrical energy from a power source and provide at least a portion of the first electrical energy to a data center during a first time period, the data center comprising multiple electronic devices that generate heat while in operation. The system also includes an electrical-to-mechanical energy conversion device configured to convert air at approximately atmospheric pressure to a compressed or liquified state using at least the portion of the first electrical energy received from the power source during the first time period. The system also includes a storage container configured to receive the air from the electrical-to-mechanical energy conversion device and store the air in the compressed or liquified state. The system also includes a mechanical-to-electrical energy conversion device configured to, during a second time period in which the metering device does not provide the first electrical energy to the data center: receive the air from the storage container in a gaseous, compressed state; generate second electrical energy for powering the data center using the air received from the storage container; and exhaust cooled air for providing to the data center to cool the electronic devices.

In a second embodiment, a method includes receiving first electrical energy from a power source at a metering device and providing at least a portion of the first electrical energy to a data center during a first time period, the data center comprising multiple electronic devices that generate heat while in operation. The method also includes converting air at approximately atmospheric pressure to a compressed or liquified state using an electrical-to-mechanical energy conversion device using at least the portion of the first electrical energy received from the power source during the first time period. The method also includes receiving the air from the electrical-to-mechanical energy conversion device and storing the air in a storage container in the compressed or liquified state. The method also includes receiving the air from the storage container in a gaseous, compressed state at a mechanical-to-electrical energy conversion device. The method also includes using the air from the storage container at the mechanical-to-electrical energy conversion device to generate second electrical energy for powering the data center during a second time period in which the metering device does not provide the first electrical energy to the data center. The method also includes exhausting cooled air from the mechanical-to-electrical energy conversion device for providing to the data center to cool the electronic devices.

In a third embodiment, a non-transitory computer readable medium embodies a computer program. The computer program comprises computer readable program code that, when executed by a processor of a computing device, cause the computing device to: control a metering device to provide first electrical energy, received from a power source, to a data center during a first time period, the data center comprising multiple electronic devices that generate heat while in operation; control an electrical-to-mechanical energy conversion device to convert air at approximately atmospheric pressure to a compressed or liquified state using at least a portion of the first electrical energy received from the power source during the first time period; control a storage container to receive the air from the electrical-to-mechanical energy conversion device and store the air in the compressed or liquified state; control a mechanical-to-electrical energy conversion device to, during a second time period in which the metering device does not provide the first electrical energy to the data center: receive the air from the storage container in a gaseous, compressed state; generate second electrical energy for powering the data center using the air received from the storage container; and exhaust cooled air for providing to the data center to cool the electronic devices.

Other technical features may be readily apparent to one skilled in the art from the following figures, descriptions, and claims.

DETAILED DESCRIPTION

Figure 1:
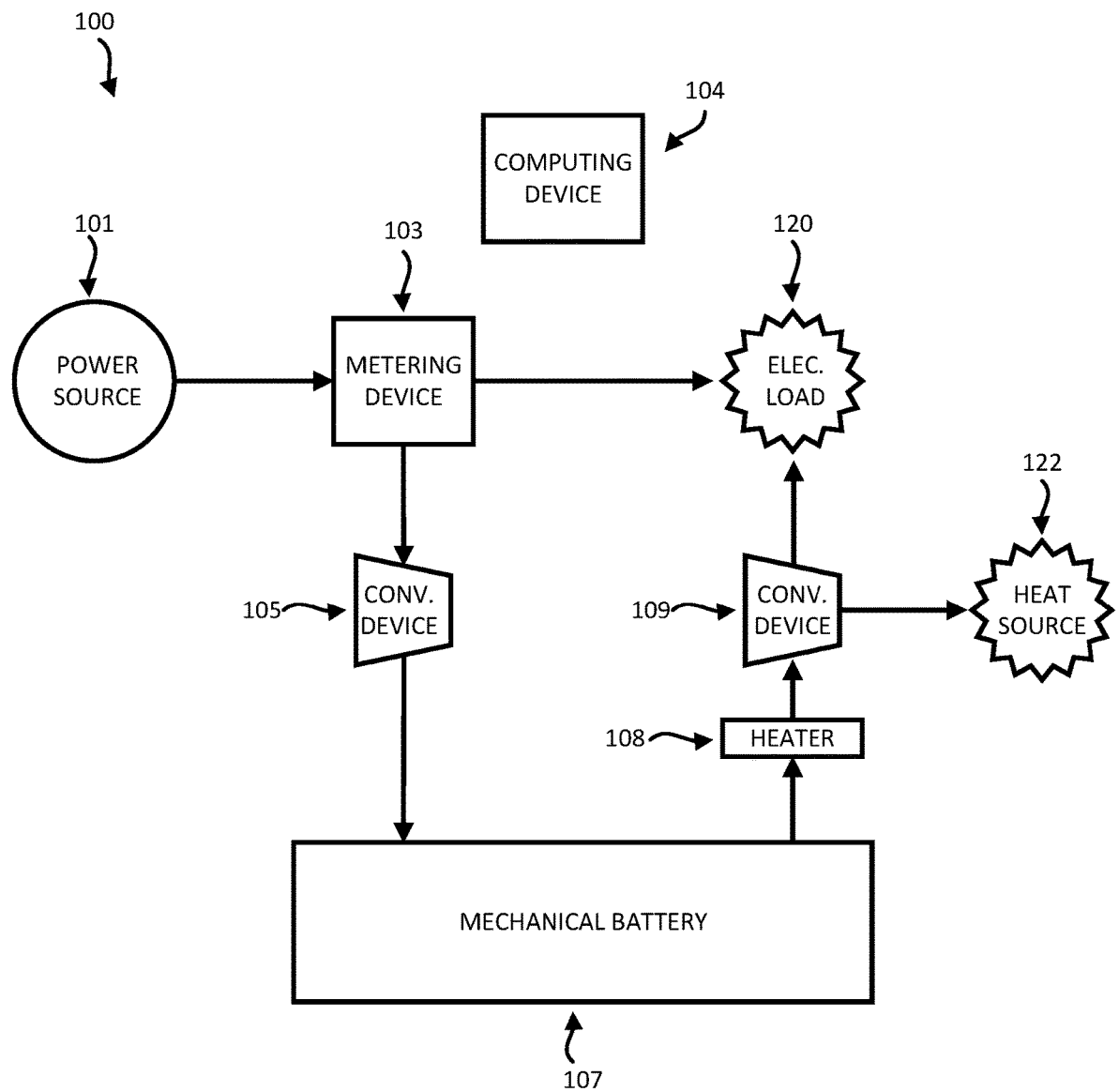
FIG. 1 illustrates an example power supply and cooling system according to various embodiments of the present disclosure.

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure.

Embodiments of the present disclosure recognize and take into account that in order to supplement the power created by renewable sources, facilities have used batteries to power the facilities during times when the renewable energy source cannot create energy. However, using batteries to store energy can be impractical due to large and sometimes unknown amounts of energy needed by the facilities. Alternatively, in order to supplement the power created by renewable sources, facilities have used generators. However, generators are usually dependent on fossil fuels which can be harmful to the environment. Finally, in order to supplement the power created by renewable sources, facilities have received power from electrical utility power grids. However, power grids are not always a viable option for facilities that require operational capacity 24 hours a day, 365 days a year, as power grids typically experience power outages. For facilities that are in constant operation, such as data centers, even short power outages can be detrimental to the operation of the facility and the integrity of the data. Additionally, in some scenarios, embodiments of the present disclosure recognize and take into account that is desirable to have a facility that is not completely reliant on a power grid.

Accordingly, embodiments of the present disclosure recognize that there is a need for a steady-state power source for facilities, like data centers, that require continuous operation capacity. Additionally, embodiments of the present disclosure recognize that facilities, such as data centers, create a significant amount of heat by constantly operating the computer systems and associated electronic devices housed within the data center. Additionally, embodiments of the present disclosure recognize that there is a need for providing cooling to the facilities so that the computer systems of the facilities may operate at an optimal temperature and not become overheated. Accordingly, embodiments of the present disclosure provide for uninterruptible power and cooling from an intermittent power source for critical power applications.

It will be understood that embodiments of this disclosure may include any one, more than one, or all of the features described here. In addition, embodiments of this disclosure may additionally or alternatively include other features not listed here. Some of the following embodiments are described with respect to devices, systems, and processes for uninterruptible power and cooling. However, such description is not limiting; it will be clear to those of skill in the art that the disclosed embodiments are also applicable in association with other types of devices, systems, and processes.

FIG. 1 illustrates an example power supply and cooling system 100 according to various embodiments of the present disclosure. The embodiment of the power supply and cooling system 100 shown in FIG. 1 is for illustration only. Other embodiments of the power supply and cooling system 100 could be used without departing from the scope of this disclosure.

The system 100 may include a power source 101 that creates or receives electrical energy. The power source 101 may create or receive electrical energy from a renewable energy source. The power source 101 may create or receive electrical energy from wind power, solar power, tidal/wave power, or any other renewable energy source (the utility grid could also provide power through the same input). As discussed in greater detail below, in addition to the power source 101, the system 100 may also receive electrical energy from a utility power grid. The utility power grid and the power source 101 may provide electrical energy to the system 100 through a same input of the system 100.

The system 100 may include a metering device 103. The metering device 103 may receive the electrical energy created or received by the power source 101, for example, during periods of time where the electrical energy is readily available and/or cost efficient, and distribute the energy to different locations within the system 100. For example, the system 100 may include a computing device 104 to control the overall operation of the system 100. The computing device 104 may be connected to the metering device 103 and/or the power source 101 to monitor the availability, reliability, and/or price of the electrical energy. For example, based on comparison of the availability, reliability, and/or price of the electrical energy to one or more baseline or threshold levels, the computing device 104 determines to convert the electrical energy for storage as potential mechanical energy. In some embodiments, the computing device 104 may be a service operated by a third party such as a person or a company. The computing device 104 may be housed and operated at a location different than the location at which the rest of the system 100 is located. That is to say, the computing device 104 is not bound to a specific location.

The metering device 103 may supply electrical power to an electrical load 120. The electrical load 120 is discussed in greater detail below. The metering device 103 may supply electrical energy to an electrical-to-mechanical energy conversion device 105. The metering device 103 may also be connected to an electrical power grid to which the metering device 103 can provide electrical energy created by the power source 101 or receive electrical energy to supply to the electrical load 120 or an electrical-to-mechanical energy conversion device 105.

The electrical-to-mechanical energy conversion device 105 may receive electrical energy from the metering device 103 and convert the electrical energy to mechanical energy. For example, the electrical-to-mechanical energy conversion device 105 may comprise a fluid compressor with a compressor motor. The fluid compressor may be configured to use electrical energy to compress a fluid, such as air. The electrical-to-mechanical energy conversion device 105 is not limited to a fluid compressor with a compressor motor. Other embodiments of the electrical-to-mechanical energy conversion device 105 could be used without departing from the scope of this disclosure.

The power supply and cooling system 100 further includes a mechanical battery 107 (or mechanical energy storage device). The mechanical battery 107 may store mechanical energy created by the electrical-to-mechanical energy conversion device 105. For example, when the electrical-to-mechanical energy conversion device 105 is a fluid compressor, the mechanical battery 107 may be a high-pressure container capable of containing the compressed fluid generated by the electrical-to-mechanical energy conversion device 105. The high-pressure container may be any manufactured or geological container suitable for containing a high-pressure fluid. In some embodiments, the mechanical battery 107 may be an above ground tank. In some embodiments, the mechanical battery 107 may be a geological formation or structure such as porous limestone, an in-ground or underground cavern, an aquifer, bedded salt, a salt dome, or the like. Other embodiments of the mechanical battery 107 could be used without departing from the scope of this disclosure.

The power supply and cooling system 100 may include a heater 108. The heater 108 may heat and decompress fluid delivered to the heater 108 from the mechanical battery 107. For example, in embodiments where the mechanical battery 107 stores compressed air, the heater 108 may heat compressed air from the mechanical battery 107. The heater 108 is configured to make the system 100 more efficient by heating and decompressing the air from the battery 107 prior to the air entering a mechanical-to-electrical energy conversion device 109, which will be discussed in greater detail below. Accordingly, one having skill in the art will understand that the heater 108 is not required for the system 100, but can be used to make the operation of the system 100 more efficient.

In other embodiments, the heater 108 may be supplied heat from a heat source 122 of the system 100. The heat source 122 of the system 100 is discussed in further detail below. When the heater 108 uses heat generated by the heat source 122, the heater 108 takes advantage of energy that would otherwise by wasted. As discussed in further detail below, the heat source 122 may be the servers, computer systems, and other electronic devices of a data center that output heat during operation. The heat output by such a heat source would typically be lost during operation of the data center. The heater 108 may use the heat generated by the heat source 122 to heat the compressed air. Thus, the heater 108 is configured to make the system 100 more efficient by effectively using energy of the system 100 that would otherwise be lost.

The heater 108 may heat the air using any of a number of different sources. The heater 108 may generate heat specifically to heat the air. In some embodiments, the heater 108 may be a gas-fired heater or an electric heater configured to heat the air from the battery 107. In other embodiments, the heater 108 may be a recuperator configured to recover waste heat from the system 100 and use the recovered heat to heat the air. In various embodiments, the recuperator 108 may be configured to recover heat generated by the electrical-to-mechanical energy conversion device 105 in compressing air. The recuperator 108 may store the heat recovered from the electrical-to-mechanical energy conversion device 105 so that the recuperator 108 can later use the heat to heat and decompress air released from the battery 107 to the mechanical-to-electrical energy conversion device 109. In some embodiments, the recuperator 108 may store the heat recovered from the electrical-to-mechanical energy conversion device 105 in a fluid, such as water or another fluid stored in one or more tanks. In some embodiments, the recuperator 108 may store the heat recovered from the electrical-to-mechanical energy conversion device 105 in a solid material, such as concrete or a heat storage ceramic material. The recuperator 108 may store heat that it recovers in any suitable heat storage medium. In various embodiments, the recuperator 108 may recover heat from sources other than the electrical-to-mechanical energy conversion device 105. In some embodiments the system 100 may include combustion turbines that can be used as an additional power source, and the recuperator 108 may recover heat from the combustion turbines. One having skill in the art will understand that the recuperator 108 may recover heat from any heat source within or outside of system 100.

The recuperator 108 is configured to make the system 100 more efficient, as the recuperator 108 recovers energy that would otherwise be lost and uses it to improve the operation of the system 100. As explained above, the recuperator 108 may recover heat generated by the electrical-to-mechanical energy conversion device 105 that would otherwise be wasted. The heat recovered by the recuperator 108 may be applied to the air provided to the mechanical-to-electrical energy conversion device 109 from the battery 107 to heat and decompress the air prior to the air entering the mechanical-to-electrical energy conversion device 109. Thus, the recuperator 108 is configured to make the system 100 more efficient by effectively using energy of the system 100 that would otherwise be lost.

The mechanical-to-electrical energy conversion device 109 may receive mechanical energy from the mechanical battery 107 and the heater 108 and convert the mechanical energy to electrical energy. For example, during periods of time where the electrical energy is not readily available and/or cost efficient, the computing device 104 may determine to discharge and convert the stored mechanical energy to electrical energy in order to power (and in some embodiments, cool) the electrical load 120. For example, the computing device 104 may, based on comparison of the availability, reliability, and/or price of the electrical energy to one or more baseline or threshold levels, determine to convert the stored potential mechanical energy into electrical energy to power the electrical load 120. For example, the computing device 104 may be connected to and cause the mechanical-to-electrical energy conversion device 109 to discharge and convert the mechanical energy to electrical energy to supply to the electrical load 120.

In various embodiments, the mechanical-to-electrical energy conversion device 109 may include a compressed air-powered flywheel, an alternator, and a turboexpander or a turbo generator configured to be pneumatically driven via the compressed air to generate electrical energy. The mechanical-to-electrical energy conversion device 109 is not limited to the stated embodiments. Other embodiments of the mechanical-to-electrical energy conversion device 109 could be used without departing from the scope of this disclosure.

The electrical load 120 may be supplied with electrical energy from the mechanical-to-electrical energy conversion device 109. As previously discussed, the electrical load 120 may also be supplied with electrical energy that is created directly by the power source 101 from the metering device 103. The electrical load 120 may be any component that consumes electrical energy. The electrical load 120 may be a building that houses electronic devices, such as a data center. Other embodiments of the electrical load 120 could be used without departing from the scope of this disclosure.

As discussed above, the system 100 may include the heat source 122. The heat source 122 may be a power-dense environment which outputs heat. The power dense environment may be part of the electrical load 120. For example, when the electrical load 120 is a data center, as described above, the heat source 122 may be the servers, computer systems, and other electronic devices of the data center that output heat during operation. Other embodiments of the heat source 122 could be used without departing from the scope of this disclosure.

The heat source 122 may be cooled by an exhaust of the mechanical-to-electrical energy conversion device 109. For example, when the mechanical-to-electrical energy conversion device 109 includes a compressed air-powered flywheel, as described above, the flywheel converts compressed air from the mechanical battery 107 to electrical energy. In the process of converting the compressed air to electrical energy, the mechanical-to-electrical energy conversion device 109 exhausts cold air. The cold air exhausted by the mechanical-to-electrical energy conversion device 109 may be supplied to the heat source 122 to cool the heat source 122. Other embodiments of cooling the heat source 122 could be used without departing from the scope of this disclosure.

Figure 2:
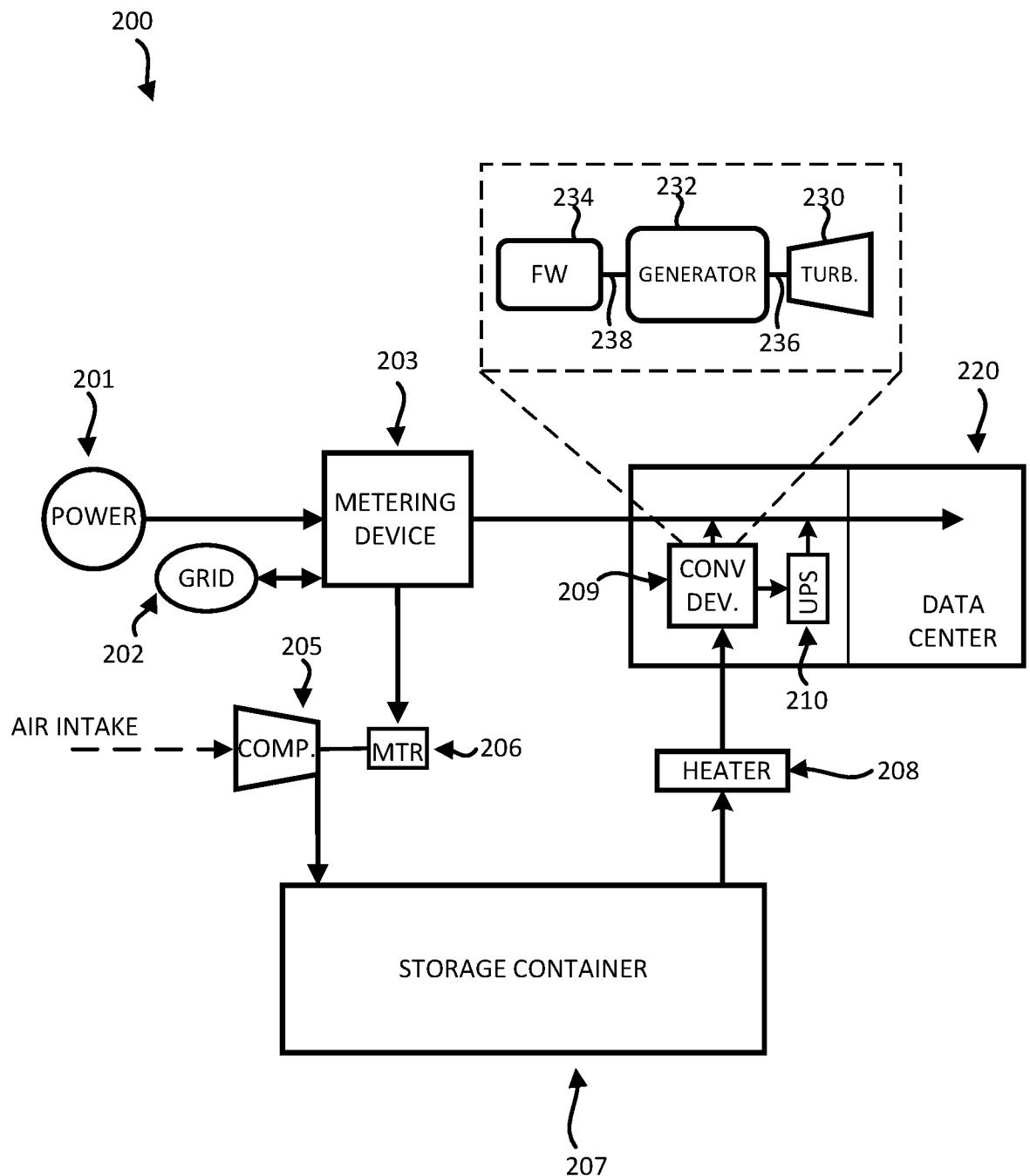
FIG. 2 illustrates an example of a power supply and cooling system in a charging mode process according to various embodiments of the present disclosure.
Figure 3:
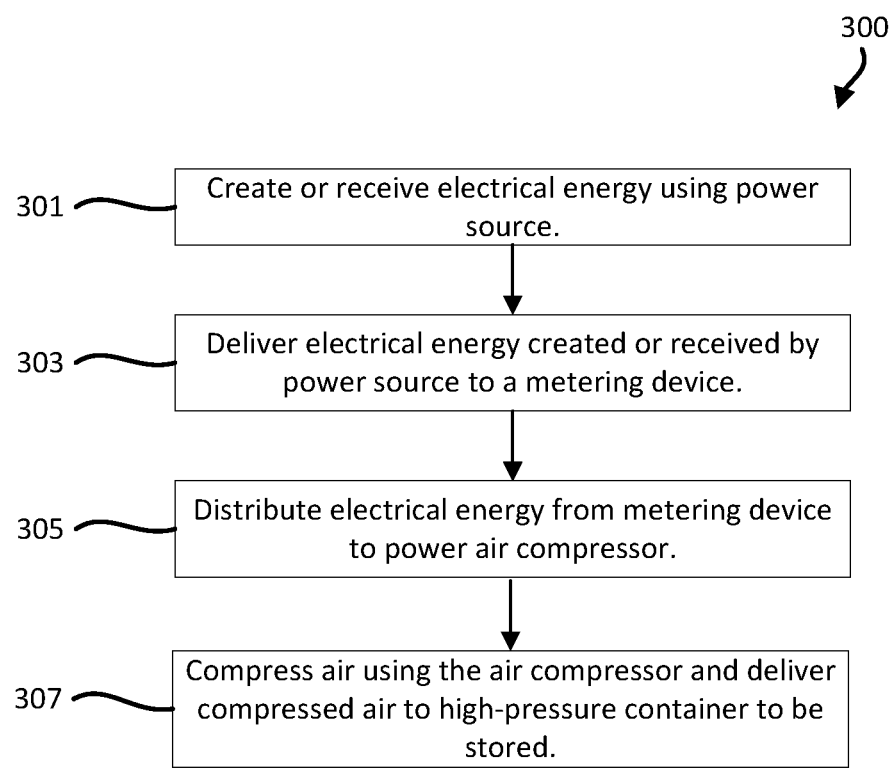
FIG. 3 is a flowchart illustrating an example of a charging mode process of a power supply and cooling system according to various embodiments of the present disclosure.

FIG. 2 illustrates an example of a power supply and cooling system 200 in a charging mode process 300 according to various embodiments of the present disclosure. The embodiment of the power supply and cooling system 200 shown in FIG. 2 is for illustration only. Other embodiments of the power supply and cooling system 200 could be used without departing from the scope of this disclosure. FIG. 3 shows a flowchart illustrating an example of the charging mode process 300 of the power supply and cooling system 200 according to various embodiments of the present disclosure. The embodiment of the charging mode process 300 shown in FIG. 3 is for illustration only. Other embodiments of the charging mode process 300 could be used without departing from the scope of this disclosure.

Referring to FIGS. 2 and 3, during the charging mode process 300, in operation 301, the system 200 creates electrical energy using a power source 201. The power source 201 may be any of the power sources 101 previously described in FIG. 1. Specifically, the power source 201 may create electrical energy from a renewable energy source. The power source 201 may create electrical energy from wind power, solar power, tidal/wave power, or any other renewable energy source. Accordingly, the power source 201 may be a wind turbine, a wave turbine, a solar panel, or the like.

In operation 303, the electrical energy created by the power source 201 is delivered to a metering device 203. The metering device 203 may be the metering device 103 of FIG. 1 described above. In FIG. 2, the arrows illustrate the flow of energy within the system 200 during the charging mode process 300.

The electrical energy created by the power source 201 is distributed by the metering device 203 to different end locations for the electrical energy. The electrical energy may be distributed by the metering device 203 directly to a data center 220. The energy created from the power source 201 may be used not only to charge the system 200, but also to directly power the electronic devices housed in the data center 220. For example, as illustrated in FIG. 2, the electrical energy from the power source 201 may directly power the computer systems housed within the data center 220. As illustrated in FIG. 2, the metering device 203 may also be electrically connected with a utility electrical power grid 202. Accordingly, the metering device 203 may deliver electrical energy created by the power source 201 to the power grid 202.

In operation 305, in order to charge the system 200, the metering device 203 may send electrical energy from the power source 201 to an electrical-to-mechanical energy conversion device such as a compressor 205. The compressor 205 may be the electrical-to-mechanical energy conversion device 105 described in FIG. 1. The compressor 205 may be a fluid compressor configured to compress a fluid such as air at approximately atmospheric pressure. The metering device 203 may deliver the electrical energy to a compressor motor 206. The compressor motor 206 may drive the compressor 205 to compress air, such as to a pressure of, e.g., 1000-4000 psi. The dashed line in FIG. 2 illustrates the air intake of the compressor 205.

In operation 307, the compressed air compressed by the compressor 205 may be delivered to a high-pressure storage container 207 by an air line connecting the exhaust of the compressor 205 and the high-pressure storage container 207. The high-pressure storage container 207 may be the mechanical battery 107 of FIG. 1 discussed above.

Specifically, the high-pressure storage container 207 may be a geological formation or structure such as porous limestone, an in-ground or underground cavern, an aquifer, bedded salt, a salt dome, or the like. Storing the compressed air in a geological structure presents many advantages over storing the compressed air in manufactured, above-ground containers. Geological structures can be substantially larger than a storage container that can be built above ground. Thus, geological structures can store a much larger volume of compressed air than the volume that can be stored in above ground containers. Accordingly, the potential mechanical energy stored in a geological structure can be much greater that what is possible using above ground containers. Additionally, storing the compressed air in geological structures may be advantageous when considering various safety concerns. Storing a large amount of potential energy, such as compressed air, in above ground containers may lead to safety concerns related to a pressure release of the compressed air, as there is a possibility that people within a critical zone of the pressure release could be injured by the resulting destruction from the release. This type of safety concern is not usually present when the compressed air is stored in a geological structure. Finally, there may also be price advantages in storing the compressed air in a geological structure rather than above-ground containers.

Even if it is feasible to provide the number of above ground containers required to store the amount of volume that can be stored in a geological structure, the price to do so may be far greater than the associated price with developing the geological structure.

The charging mode process 300 may be performed in different advantageous situations. For example, as part of operation 305, the system 200 may determine situations in which the power source 201 creates more electrical energy than what can be used by the data center 220. In these situations, instead of selling the unused energy back to the power grid 202, the energy can be stored as mechanical energy. By storing the excess energy, the system 200 may be completely self-reliant on the power source 201 and not require a tie-in connection to a power grid 202. Accordingly, a developer is not limited to building a data center 220 in a location with a power grid. Instead, the data center 220 can be built in a location with a suitable renewable energy source for the power source 201 and with proper geological formations such that the mechanical energy can be stored in a geological structure.

For example, if the power source 201 is a solar farm, during the day the solar farm may produce more energy than what is needed to power the data center 220. However, at night, the solar farm may not produce any energy to power the data center 220. Accordingly, the system 200 can store the excess energy created by the solar farm during the day as mechanical energy in the form of compressed air in the high-pressure storage container 207. As will be discussed in greater detail below, the compressed air can then be converted to electrical energy to power the data center 220 at night when the solar farm does not create electrical energy for the data center 220.

Similarly, if the power source 201 is a wind farm, there may be a time periods in which there are large amounts of wind and the wind farm may create more electrical energy than can be used by the data center 220. The excess of electrical energy created by the wind farm during these windy days can be stored as mechanical energy, as described above, so that the mechanical energy can be converted to electrical energy to power the data center 220 during time periods when there is no wind and the wind farm does not directly create electrical energy to power the data center 220.

In these ways, the data center 220 can be substantially or completely reliant on renewable energy to power the data center 220. One having skill in the art will understand that the system 200 can be operated in ways different than what has been explicitly described such that the data center 220 is substantially or completely reliant on renewable energy to power the data center 220.

It may also be advantageous to perform the charging mode process 300 so that the stored energy can be used by the data center 220 or sold to back to the power grid 202. For example, as discussed above, the system 200 may be connected to the power grid 202. When energy prices from the power grid 202 are low, it may be advantageous to power the data center 220 with energy from the power grid 202 and store all of the energy being created by power source 201 as mechanical energy in the storage container 207. Then, when energy prices from the power grid 202 are high, the system 200 can use energy created by the power source 201 to power the data center 220, and any excess energy created by the power source 201 can be sold back to the power grid 202 at the high price. In other embodiments, when the prices for electricity from the power grid 202 are high, the data center 220 can be powered by the energy stored in the storage container 207 (as will be described in greater detail below) and all of the energy created by the power source 201 can be sold back to the power grid 202 at the high price.

One having skill in the art will understand that the data center 220 can be powered by any combination of energy from the power source 201, energy from the power grid 202, or energy from the storage container 207. The embodiments above are non-limiting examples of how the system 200 can be operated advantageously according to energy prices from the power grid 202. One having skill in the art will understand that this disclosure includes other advantageous operations of the system 200 based on the price of electrical energy provided by the power grid 202.

Although FIGS. 2 and 3 illustrate examples for a charging mode process 300 of the system 200, various changes may be made to FIGS. 2 and 3. For example, in some embodiments, the system 200 does not include a power source 201. In these embodiments, the system 200 may receive electrical energy from the power grid 202. In these and other embodiments, the electrical energy supplied to the system 200 may be a constant, i.e., not intermittent, and the system 200 may be operated based on factors other than the presence or absence of power being produced by a power source. As discussed in further detail below, the system 200 can be operated according to a number of different factors, such as a price of electrical energy from the power grid 202.

In areas where electrical utility power is available, e.g., from the power grid 202, the system 200 can be used to provide a variety of ancillary services for the power grid 202. During peak times, the compressed air storage can be used to provide services including, but not limited to, additional power through the net metering device, voltage regulation, frequency regulation, or other load-resource applications to the power grid 202. Thus, the system 200 provides useful services to the power grid 202, for example, when needed or advantageous to the utility service provider. As further strain is encountered by energy grids, efficient methods of energy production are required to offset increased demands, which can be dispatched via the system 200 at a reduced or minimal lead times.

Figure 4:
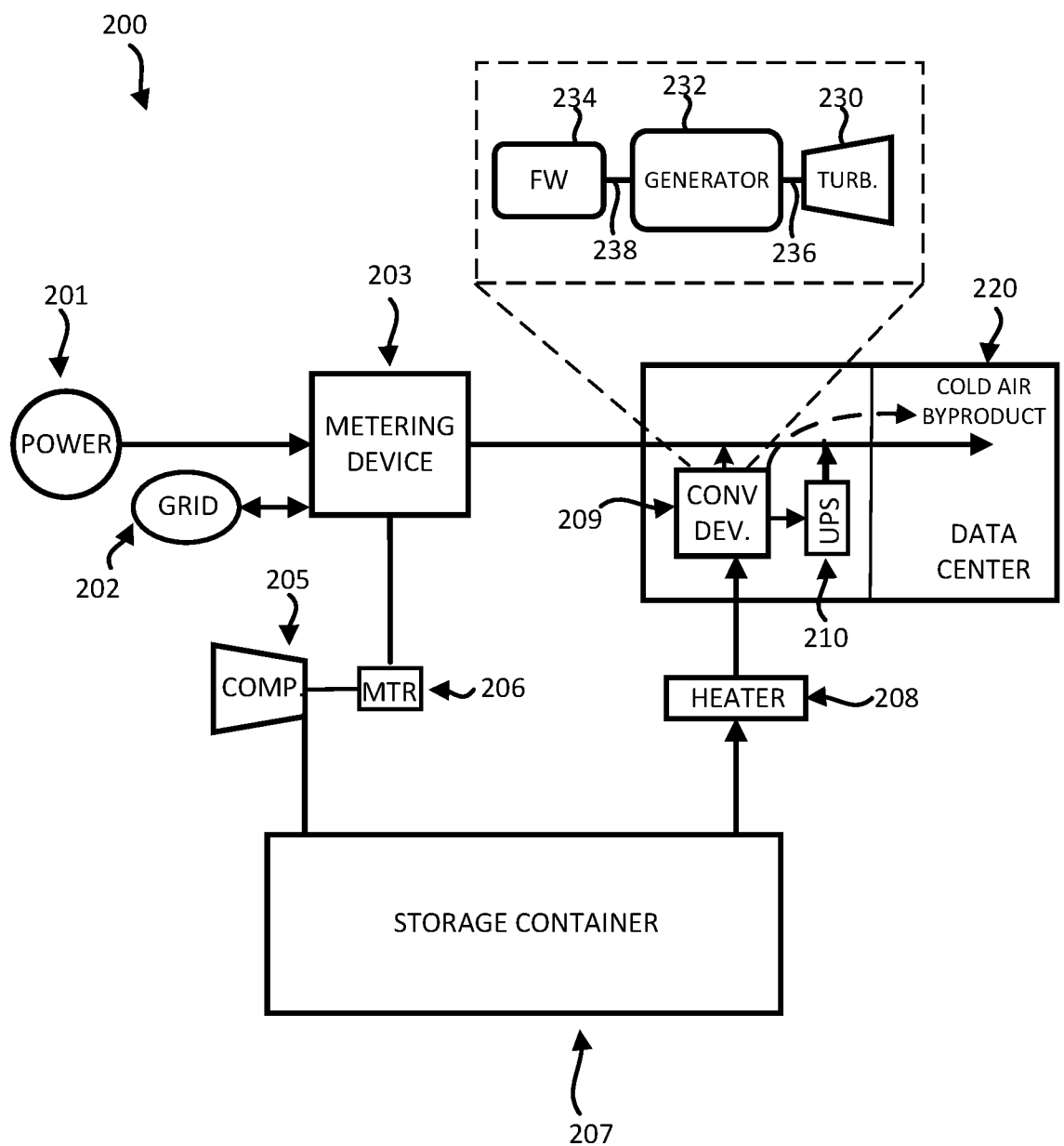
FIG. 4 illustrates an example of a power supply and cooling system in a discharging mode process according to various embodiments of the present disclosure.
Figure 5:
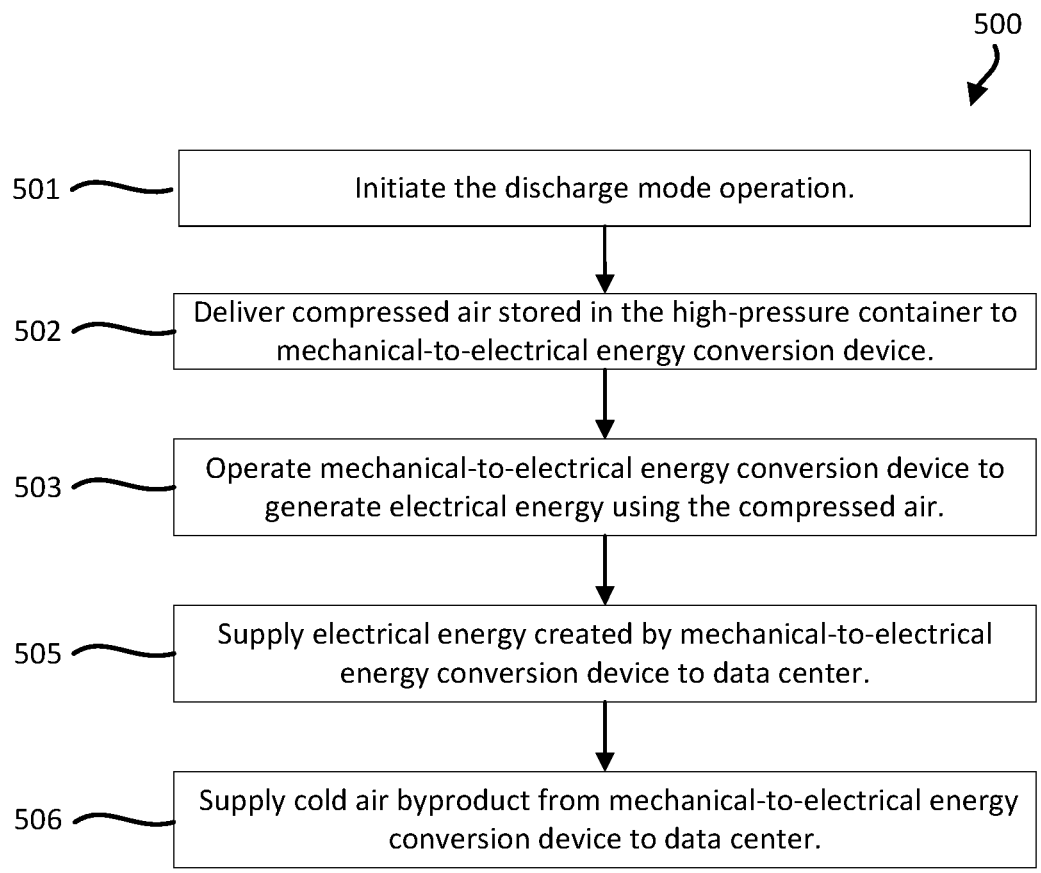
FIG. 5 is a flowchart illustrating an example of a discharging mode process of a power supply and cooling system according to various embodiments of the present disclosure.

FIG. 4 illustrates an example of the power supply and cooling system 200 in a discharging mode process 500 according to various embodiments of the present disclosure. The embodiment of the power supply and cooling system 200 shown in FIG. 4 is for illustration only. Other embodiments of the system 200 could be used without departing from the scope of this disclosure. FIG. 5 shows a flowchart illustrating an example of the discharging mode process 500 of the power supply and cooling system 200 according to various embodiments of the present disclosure. The embodiment of the discharging mode process 500 shown in FIG. 5 is for illustration only. Other embodiments of the discharging mode process 500 could be used without departing from the scope of this disclosure.

FIG. 4 illustrates that, in the discharging mode process 500, the power source 201 produces electrical energy and provides the energy to the metering device 203. The metering device 203, as discussed above, can direct electrical energy from the power source 201 and the power grid 202 to the data center 220 to be used by electronic devices housed in the data center 220 as previously discussed. While FIG. 4 illustrates that power is delivered to the data center 220 from the metering device 203, one having skill in the art will recognize that the system 200 may perform the discharging mode process 500 without being provided electrical energy from the power source 201 or the power grid 202. During the discharging mode process 500, the data center 220 may only be supplied with electrical energy produced from the mechanical energy stored in the storage container 207. The process of providing electrical energy to the data center 220 from the mechanical energy stored in the storage container 207 will be discussed in greater detail below.

Referring to FIGS. 4 and 5, during the discharging mode process 500, in operation 501, the system 200 first determines that the discharging mode process 500 is to be initiated. As will be discussed in greater detail below, the determination made in operation 501 may be made by a computing device of the system 200. As will be discussed in greater detail below, the system 200 may determine when to initiate the discharging mode process 500 based on a number of different factors that result in advantageous scenarios for performing the discharging mode process 500.

In operation 502, the mechanical energy stored in the high-pressure storage container 207 is delivered, as compressed air, to a mechanical-to-electrical energy conversion device 209. The mechanical-to-electrical energy conversion device 209 may be the mechanical-to-electrical energy conversion device 109 described in FIG. 1 above. As shown in FIG. 4, the mechanical-to-electrical energy conversion device 209 includes a turbine 230, a generator or alternator 232 (herein referred to as simply "generator"), and a flywheel 234. In various embodiments, the rotor of the generator 232 may be coupled to a spinning shaft 236 of the turbine 230 to generate electrical energy. In various embodiments, the shaft 236 of the turbine 230 may also be coupled to the flywheel 234, such that the turbine 230, the generator 232, and the flywheel 234 are on a common shaft or axis (236 and 238). In some embodiments, the turbine 230, the generator 232, the flywheel 234, and the shaft(s) 236, 238 can be oriented along a horizontal axis. However, this disclosure is not limited to horizontal arrangements. For example, in some embodiments, one or more of these components, including the flywheel 234 and the shaft(s) 236, 238, can be oriented vertically.

The compressed air delivered to the mechanical-to-electrical energy conversion device 209 from the storage container 207 may first pass through a heater 208 so that the air from the storage container 207 can be heated and decompressed prior to entering the mechanical-to-electrical energy conversion device 209. The temperature of the air may depend on the volume of air moving across the orifice. In some embodiments, the air temperature is below freezing (i.e., less than 32° F.). The heater 208 may be the heater 108 described in FIG. 1.

In operation 503, the mechanical-to-electrical energy conversion device 209 may create electrical energy using the mechanical energy provided to the mechanical-to-electrical energy conversion device 209 from the storage container 207. Accordingly, an air line may connect the storage container 207 and the mechanical-to-electrical energy conversion device 209 to deliver compressed air from the storage container 207 to the mechanical-to-electrical energy conversion device 209. The mechanical-to-electrical energy conversion device 209 may then be operated by the supplied compressed air to create electrical energy. For example, the compressed air may be supplied to the turbine 230. The turbine 230 is powered by the compressed air to spin the shaft 236 coupled with the generator 232. The generator 232 is configured to convert the mechanical energy created by the turbine 230 into electrical energy.

In addition, the spinning shaft 236 of the turbine 230 may spin the shaft 238 of the flywheel 234. The mechanical energy supplied to the turbine 230 can be stored in the momentum of the spinning flywheel 234. In some embodiments, small amounts of electrical energy or small amounts of compressed air can keep the turbine 230, the generator 232, and the flywheel 234 spinning. Accordingly, if the turbine 230 ever ceases to provide mechanical energy to the generator 232, the mechanical energy stored in the momentum of the spinning flywheel 234 can be used to power the data center 220 and/or the generator 232 so that the generator 232 can continue to generate electrical energy even when the turbine 230 is not in operation or is operating at reduced speed, for example, during start up or switch over. That is, the flywheel 234 keeps the common shaft 236, 238 spinning long enough to have the air valve open and the turbine 230 once again provide the power to rotate the common shaft 236, 238. Additionally or alternatively, in some embodiments, the system 200 can include a belted or geared electric motor (not shown) that can rotate the common shaft 236, 238 during non-production periods.

In operation 505, the electrical energy generated by the mechanical-to-electrical energy conversion device 209 may be supplied to the data center 220 to power the electrical devices of the data center 220. A byproduct of the electrical energy generation of the mechanical-to-electrical energy conversion device 209 is cold air (e.g., air having a temperature less than 50° F.). In operation 506, the cold air byproduct of the mechanical-to-electrical energy conversion device 209 can be supplied to a heat source in the data center 220. For example, the data center 220 may house computer systems and other associated electronic devices. The computer systems and electronic devices of the data center can be powered by the mechanical-to-electrical energy conversion device 209, as previously discussed. While operating, the computer systems and electronic devices of the data center 220 may generate a substantial amount of heat and may need to be cooled to ensure proper operation of the computer systems. In operation 506, while being powered by electrical energy created by the mechanical-to-electrical energy conversion device 209 in operation 505, the computer systems and electronic devices of the data center 220 may be cooled by the cold air byproduct exhausted by the mechanical-to-electrical energy conversion device 209. For example, the cooled air may be supplied to the data center via ducting and/or the exhaust side of the mechanical-to-electrical energy conversion device 209 may be proximate to the data center. In other examples, the cooled air may indirectly provide cooling to the data center, for example, by cooling a fluid supplied to and/or circulated from heat exchanger(s) in the data center. In this way, the mechanical-to-electrical energy conversion device 209 both powers and cools the computer systems and electronic devices of the data center 220.

As described in detail above, the discharging mode process 500 may be utilized in various scenarios. As previously described, in certain scenarios it may be advantageous for the system 200 to sell energy back to the power grid 202 based on the price of energy from the grid. For example, when energy prices from the power grid 202 are high, it may be advantageous to sell the electrical energy created by power source 201 to the power grid 202. When energy is being sold from power source 201 to the power grid 202, power may be created by the discharging mode process 500 as described above to supply power to the data center 220.

Additionally, the discharging mode process 500 may be used in situations in which the power source 201 is not producing an amount of electrical energy adequate for powering the electrical load of the data center 220. For example, the discharging mode process 500 may be performed to create electrical energy for the data center 220 at night when the power source 201 is a solar farm. As another example, the discharging mode process 500 may be performed to provide the data center 220 with electrical energy when the power source 201 is a windfarm and there is not enough wind to power the power source 201. The scenarios above are only listed as examples of when a discharging mode process 500 can be performed. One having skill in the art will recognize that there are other scenarios in which it may be advantageous for the system 200 to perform the discharging mode process 500 to provide the data center 220 with electrical energy from mechanical energy stored by the system 200.

As illustrated in in FIG. 4, the system 200 may include an uninterruptible power supply 210. Uninterruptible power supplies are used to provide power to a load when a main source of power fails. Uninterruptible power supplies provide power to a load from a battery source. Uninterruptible power supplies may supply near-instantaneous protection from input power interruptions. Accordingly, uninterruptible power supplies may be configured to provide power to a load within a certain amount of time after detecting that a main power source has failed in providing power to the load. As previously discussed, the storage container 207 containing mechanical energy can be considered a mechanical battery. Accordingly, the uninterruptible power supply 210 can be configured to treat the storage container 207 and the mechanical-to-electrical energy conversion device 209 as a mechanical battery from which it supplies electrical energy to the data center 220 when a main source of power from the power grid 202 and/or the power source 201 fails. Accordingly, the uninterruptible power supply 210 may initiate the discharging mode process 500 in order to supply the data center 220 with electrical energy in response to detecting that the power grid 202 and/or the power source 201 fails to provide power to the data center 220.

Figure 6:
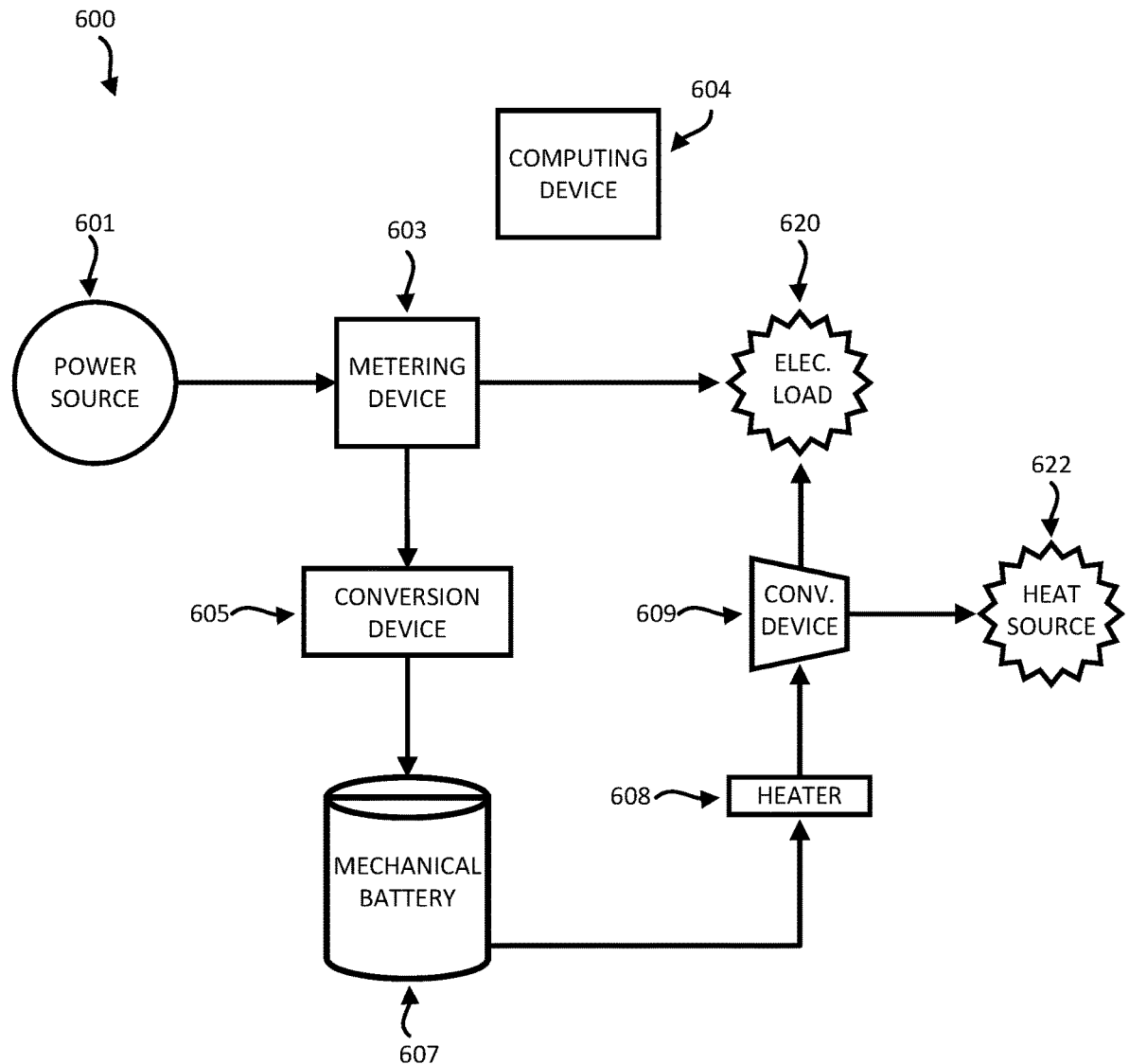
FIG. 6 illustrates another example power supply and cooling system according to various embodiments of the present disclosure.

FIG. 6 illustrates an example power supply and cooling system 600 according to various embodiments of the present disclosure. The embodiment of the power supply and cooling system 600 shown in FIG. 6 is for illustration only. Other embodiments of the power supply and cooling system 600 could be used without departing from the scope of this disclosure.

The system 600 may include a power source 601 that creates or receives electrical energy. The power source 601 may create or receive electrical energy from a renewable energy source. The power source 601 may create or receive electrical energy from wind power, solar power, tidal/wave power, or any other renewable energy source (the utility grid could also provide power through the same input). As discussed in greater detail below, in addition to the power source 601, the system 600 may also receive electrical energy from a utility power grid. The utility power grid and the power source 601 may provide electrical energy to the system 600 through a same input of the system 600.

The system 600 may include a metering device 603. The metering device 603 may receive the electrical energy created or received by the power source 601, for example, during periods of time where the electrical energy is readily available and/or cost efficient, and distribute the energy to different locations within the system 600. For example, the system 600 includes a computing device 604 to control the overall operation of the system 600. The computing device 604 may be connected to the metering device 603 and/or the power source 601 to monitor the availability, reliability, and/or price of the electrical energy. For example, based on comparison of the availability, reliability, and/or price of the electrical energy to one or more baseline or threshold levels, the computing device 604 determines to convert the electrical energy for storage as potential mechanical energy. In some embodiments, the computing device 604 may be a service operated by a third party such as a person or a company. The computing device 604 may be housed and operated at a location different than the location at which the rest of system 600 is located. That is to say, the computing device 604 is not bound to a specific location.

The metering device 603 may supply electrical power to an electrical load 620. The electrical load 620 is discussed in greater detail below. The metering device 603 may supply electrical energy to an electrical-to-mechanical energy conversion device 605. The metering device 603 may also be connected to an electricity grid to which the metering device 603 can provide electrical energy created by the power source 601 or receive electrical energy to supply to the electrical load 620 or the electrical-to-mechanical energy conversion device 605.

The electrical-to-mechanical energy conversion device 605 may receive electrical energy from the metering device 603 and convert the electrical energy to mechanical energy. For example, the electrical-to-mechanical energy conversion device 605 may comprise a gas-to-liquid conversion device. The gas-to-liquid conversion device may be configured use electrical energy to convert a gas to a liquid. The gas-to-liquid conversion device may incorporate any known gas liquification system. For example, the gas-to-liquid conversion device may operate a Linde-Hampson cycle to convert gas to a liquid. The gas-to-liquid conversion device may repeatedly perform a cycle of compressing, cooling, and expanding a gas to reduce the temperature of the gas and convert the gas to a liquid. Accordingly, the gas-to-liquid conversion device may include compressors, coolers, heat exchangers, separators, expanders, and other equipment necessary for converting the gas to a liquid. The gas-to-liquid conversion device may be used to convert any of a number of gases to liquid. In various embodiments, the gas-to-liquid conversion device is used to convert ambient air of the system 600 to liquified air.

The electrical-to-mechanical energy conversion device 605 is not limited to a gas-to-liquid conversion device. Other embodiments of the electrical-to-mechanical energy conversion device 605 could be used without departing from the scope of this disclosure.

The system 600 further includes a mechanical battery 607 (or mechanical energy storage device). The mechanical battery 607 may store mechanical energy created by the electrical-to-mechanical energy conversion device 605. For example, when the electrical-to-mechanical energy conversion device 605 is a gas-to-liquid conversion device, the mechanical battery 607 may be an insulated container capable of containing the liquid gas generated by the gas-to-liquid conversion device. The container may be any container suitable for containing the liquified gas. In some embodiments, the mechanical battery 607 may be a storage tank insulated and refrigerated to maintain a desired temperature of the liquid gas generated by the gas-to-liquid conversion device. Other embodiments of the mechanical battery 607 could be used without departing from the scope of this disclosure.

The system 600 may include a heater 608. The heater 608 may heat and gasify the liquified gas delivered to the heater 608 from the mechanical battery 607 to convert the liquified gas back to a gaseous state. For example, in embodiments where the mechanical battery 607 stores liquified air, the heater 608 may heat the liquified air from the mechanical battery 607 to gasify the liquified air back to a gaseous state. The heater 608 is configured to make the system 600 more efficient by improving the gasification of the liquified air from the battery 607 prior to the air entering a mechanical-to-electrical energy conversion device 609, which will be discussed in greater detail below. In various embodiments, the heater 608 may not be required for the gasification of the liquified air stored in battery 607. In these embodiments, atmospheric heat acting on the liquified air as the liquified air travel from the battery 607 to the mechanical-to-electrical energy conversion device 609 may be enough to convert the liquified air to a gaseous state. For example, liquified air may be stored in the battery 607 below the temperature at which liquified air converts to its gaseous state (e.g., approximately −320 degrees Fahrenheit at atmospheric pressure). The atmospheric heat will convert liquified air to its gaseous state. In this example, the heater 608 is configured to accelerate the conversion of liquified gas from a liquid to a gas. Accordingly, one having skill in the art will understand that the heater 608 is not required for the system 600 but may be used to make the operation of the system 600 more efficient.

The heater 608 may heat the air using any of a number of different sources. The heater 608 may generate heat specifically to heat the air. In some embodiments, the heater 608 may be a gas-fired heater or an electric heater configured to heat the liquified air from the battery 607. In other embodiments, the heater 608 may be supplied heat from a heat source 622 of the system 600. The heat source 622 of the system 600 is discussed in further detail below. When the heater 608 uses heat generated by the heat source 622, the heater 608 takes advantage of energy that would otherwise by wasted. As discussed in further detail below, the heat source 622 may be the servers, computer systems, and other electronic devices of a data center that output heat during operation. The heat output by such a heat source would typically be lost during operation of the data center. The heater 608 may use the heat generated by the heat source 622 to heat the liquified air to convert the liquified air to a gaseous state. Thus, the heater 608 is configured to make the system 600 more efficient by effectively using energy of the system 600 that would otherwise be lost.

The gasification of the liquified air results in an increase in pressure of the gaseous air due to the liquid expanding to a gaseous state. The air released from the battery 607 is released as liquified air at approximately atmospheric pressure. The liquified air is then heated to be converted to a gaseous state either solely with atmospheric heat or additionally with the heater 608. During this heating process, the liquified air turns to a gaseous state and becomes pressurized above atmospheric pressure. The pressurized, or compressed, gaseous air is then supplied to the mechanical-to-electrical energy conversion device 609.

The mechanical-to-electrical energy conversion device 609 may receive mechanical energy from the mechanical battery 607 and the heater 608 and convert the mechanical energy to electrical energy. For example, during periods of time where the electrical energy is not readily available and/or cost efficient, the computing device 604 may determine to discharge and convert the stored mechanical energy to electrical energy in order to power (and in some embodiments, cool) the electrical load 620. For example, the computing device 604 may, based on comparison of the availability, reliability, and/or price of the electrical energy to one or more baseline or threshold levels, determine to convert the stored potential mechanical energy into electrical energy to power the load 620. For example, the computing device 604 may be connected to and cause the mechanical-to-electrical energy conversion device 609 to discharge and convert the mechanical energy to electrical energy to supply the load 620.

In various embodiments, the mechanical-to-electrical energy conversion device 609 may include a compressed air-powered flywheel, an alternator, and a turboexpander or a turbo generator configured to be pneumatically driven via the compressed air to generate electrical energy. The mechanical-to-electrical energy conversion device 609 is not limited to the stated embodiments. Other embodiments of the mechanical-to-electrical energy conversion device 609 could be used without departing from the scope of this disclosure.

The electrical load 620 may be supplied with electrical energy from the mechanical-to-electrical energy conversion device 609. As previously discussed, the electrical load 620 may also be supplied with electrical energy that is created directly by the power source 601 from the metering device 603. The electrical load may be any component that consumes electrical energy. The electrical load 620 may represent a building that houses electronic devices, such as a data center. Other embodiments of the electrical load 620 could be used without departing from the scope of this disclosure.

The heat source 622 may be a power-dense environment which outputs heat. The power-dense environment may be part of the electrical load 620. For example, when the electrical load 620 is a data center, as described above, the heat source 622 may be the servers, computer systems and other electronic devices of the data center that output heat during operation. Other embodiments of the heat source 622 could be used without departing from the scope of this disclosure.

The heat source 622 may be cooled by an exhaust of the mechanical-to-electrical energy conversion device 609. For example, the mechanical-to-electrical energy conversion device 609 can convert compressed air from the mechanical battery 607 to electrical energy. In the process of converting the compressed air to electrical energy, the mechanical-to-electrical energy conversion device 609 exhausts cold air. The cold air exhausted by the mechanical-to-electrical energy conversion device 609 may be supplied to the heat source 622 to cool the heat source 622. Other embodiments of cooling the heat source 622 could be used without departing from the scope of this disclosure.

Figure 7:
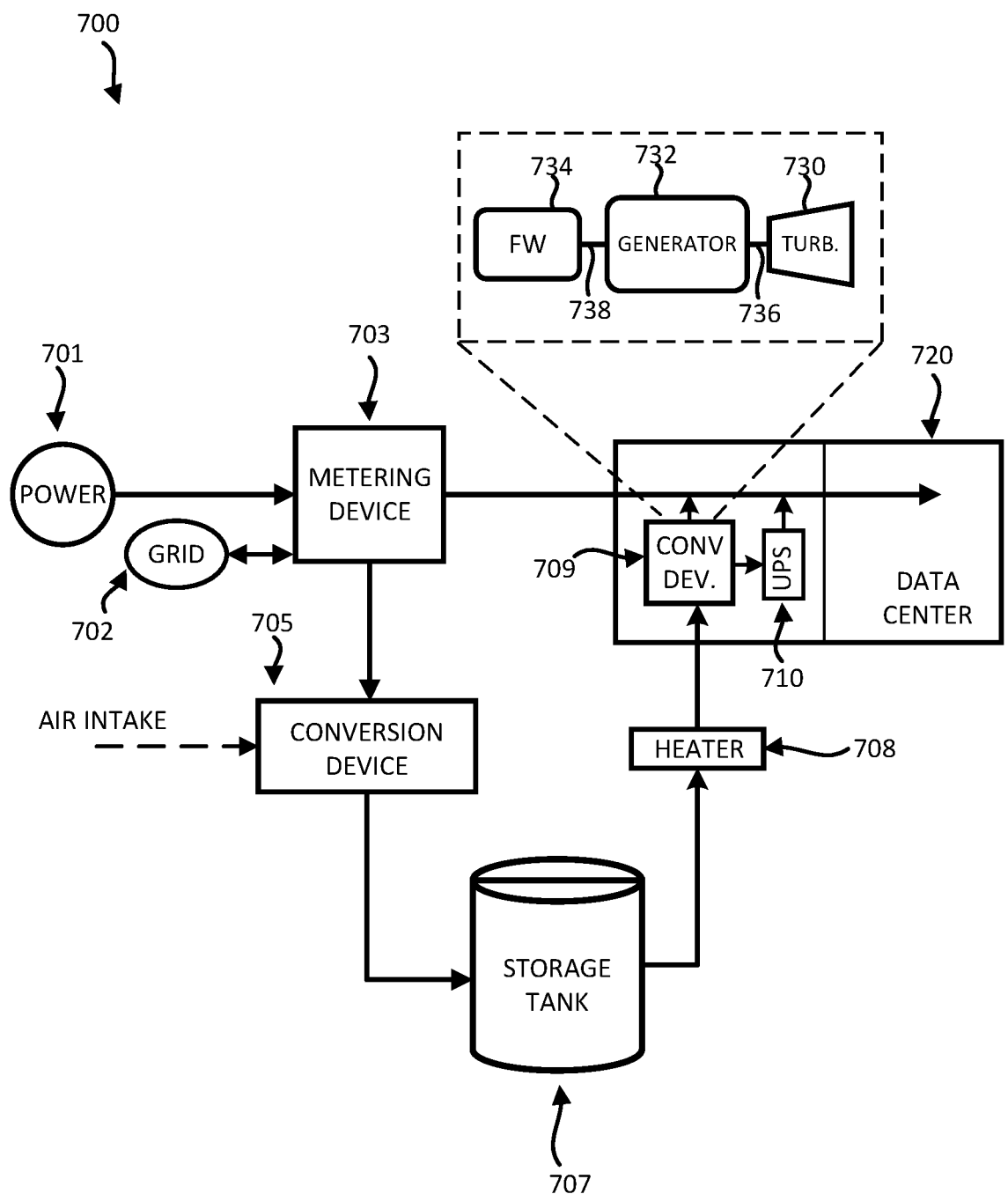
FIG. 7 illustrates another example of a power supply and cooling system in a charging mode process according to various embodiments of the present disclosure.
Figure 8:
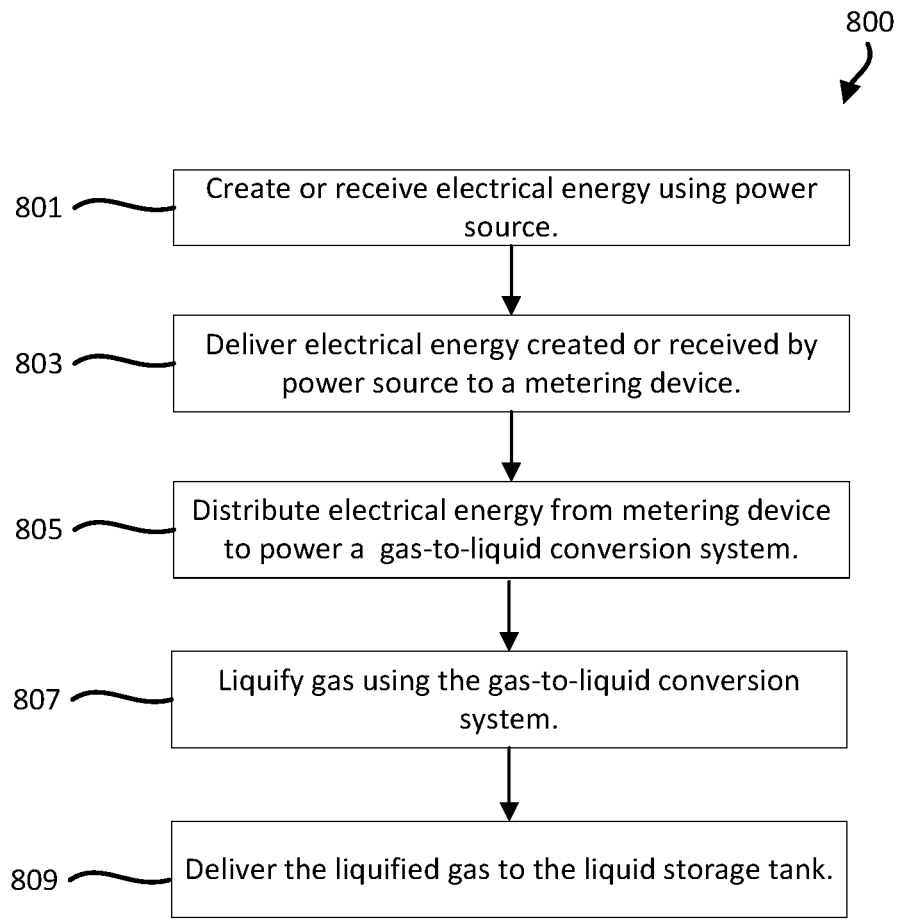
FIG. 8 is a flowchart illustrating another example of a charging mode process of a power supply and cooling system according to various embodiments of the present disclosure.

FIG. 7 illustrates an example of a power supply and cooling system 700 in a charging mode process 800 according to various embodiments of the present disclosure. The charging mode process 800 may also be referred to as a liquification process, as the charging mode process 800 includes converting a gas to a liquid. The embodiment of the power supply and cooling system 700 shown in FIG. 7 is for illustration only. Other embodiments of the power supply and cooling system 700 could be used without departing from the scope of this disclosure. FIG. 8 shows a flowchart illustrating an example of the charging mode process 800 of the power supply and cooling system 700 according to various embodiments of the present disclosure. The embodiment of the charging mode process 800 shown in FIG. 8 is for illustration only. Other embodiments of the charging mode process 800 could be used without departing from the scope of this disclosure.

Referring to FIGS. 7 and 8, during the charging mode process 800, in operation 801, the system 700 creates electrical energy using a power source 701. The power source 701 may be any of the power sources 601 previously described in FIG. 6. Specifically, the power source 701 may create electrical energy from a renewable energy source. The power source 701 may create electrical energy from wind power, solar power, tidal/wave power, or any other renewable energy source. Accordingly, the power source 701 may be a wind turbine, a wave turbine, a solar panel, or the like.

In operation 803, the electrical energy created by the power source 701 is delivered to a metering device 703. The metering device 703 may be the metering device 603 of FIG. 6 described above. In FIG. 7, the arrows illustrate the flow of energy within the system 700 during the charging mode process 800.

The electrical energy created by the power source 701 is distributed by the metering device 703 to different end locations for the electrical energy. The electrical energy may be distributed by the metering device 703 directly to a data center 720. The energy created from power source 701 may be used not only to charge the system 700, but also to directly power the electronic devices housed in the data center 720. For example, as illustrated in FIG. 7, the electrical energy from the power source 701 may directly power the computer systems housed within the data center 720. As illustrated in FIG. 7, the metering device 703 may also be electrically connected with a power grid 702. Accordingly, the metering device 703 may deliver electrical energy created by the power source 701 to the power grid 702.

In operation 805, in order to charge the system 700, the metering device 703 may send electrical energy from the power source 701 to an electrical-to-mechanical energy conversion device such as a gas-to-liquid conversion device 705. The gas-to-liquid conversion device 705 may be the electrical-to-mechanical energy conversion device 605 describe in FIG. 6. The gas-to-liquid conversion device 705 may be configured to convert ambient air of the system 700 to liquified air. The metering device 703 may deliver the electrical energy to a power supply of the gas-to-liquid conversion device 705 to power the compressors, coolers, heat exchangers, and other associated equipment of the gas-to-liquid conversion device 705. The dashed line in FIG. 7 illustrates the ambient air intake of gas-to-liquid conversion device 705.

In operation 807, the gas-to-liquid conversion device 705 may operate to liquify a gas. The gas-to-liquid conversion device 705 may liquify any liquifiable gas. In one embodiment, gas-to-liquid conversion device 705 may convert ambient air of the system 700 to a liquid. The gas-to-liquid conversion device 705 may liquify any liquifiable gas without departing from the scope of this disclosure. The gas-to-liquid conversion device 705 may incorporate any known gas liquification system. For example, the gas-to-liquid conversion device 705 may operate a Linde-Hampson cycle to convert gas to a liquid. The gas-to-liquid conversion device 705 may repeatedly perform a cycle of compressing, cooling, and expanding air to reduce the temperature of the air and liquify the air. The gas-to-liquid conversion device 705 may incorporate other methods of liquifying gas without departing from the scope of the scope of this disclosure.

In operation 809, the liquified air from the gas-to-liquid conversion device 705 may be delivered to a storage tank 707 by a liquid line connecting a liquid outlet of gas-to-liquid conversion device 705 and an inlet of the storage tank 707. The storage tank 707 may be the mechanical battery 607 of FIG. 6 discussed above. One having skill in the art will recognize the storage tank 707 may include any number of storage tanks and is not limited to a single storage tank. Specifically, the storage tank 707 may be configured to store the liquified air at atmospheric pressure. To store the liquified air at atmospheric pressure, the storage tank 707 keeps the liquified air below the temperature at which liquified air converts to its gaseous state (e.g., approximately −320 degrees Fahrenheit at atmospheric pressure). Accordingly, the storage tank 707 may be insulated and may include refrigeration systems to ensure that the liquified air is kept in a liquid state within the storage tank 707. One having skill in the art will recognize that the storage tank 707 may be used in any size or quantity according to the specific operations of the system 700.

The charging mode process 800 may be performed in different advantageous situations. For example, as part of operation 805, the system 700 may determine situations in which the power source 701 creates more electrical energy than what can be used by the data center 720. In these situations, instead of selling the unused energy back to the power grid 702, the energy can be stored as mechanical energy. By storing the excess energy, the system 700 may be completely self-reliant on the power source 701 and not require tie-in connection to a power grid. Accordingly, a developer is not limited to building a data center 720 in a location with a power grid. Instead, the data center 720 can be built in a location with a suitable renewable energy source for the power source 701.

For example, if the power source 701 is a solar farm, during the day the solar farm may produce more energy than what is needed to power the data center 720. However, at night, the solar farm may not produce any energy to power the data center 720. Accordingly, the system 700 can store the excess energy created by the solar farm during the day as mechanical energy in the form of liquified air in the storage tank 707. As will be discussed in greater detail below, the liquified air can then be converted back to its gaseous state and be used to generate electrical energy to power the data center 720 at night when the solar farm does not create electrical energy for the data center 720.

Similarly, if the power source 701 is a wind farm, there may be time periods in which there are large amounts of wind and the wind farm may create more electrical energy than can be used by the data center 720. The excess of electrical energy created by the wind farm during these windy days can be stored as mechanical energy, as described above, so that the mechanical energy can be converted to electrical energy to power the data center 720 during times when there is no wind and the wind farm does not directly create electrical energy to power the data center 720.

In these ways, the data center 720 can be substantially or completely reliant on renewable energy to power the data center 720. One having skill in the art will understand that the system 700 can be operated in ways different than what has been explicitly described such that data center 720 is substantially or completely reliant on renewable energy to power the data center 720.

It may also be advantageous to perform the charging mode process 800 so that the stored energy can be used by the data center 720 at a later time when electrical energy created by power source 701 can be sold back to the power grid 702. For example, as discussed above, the system 700 may be connected to the power grid 702. When energy prices from the power grid 702 are low, it may be advantageous to power the data center 720 with energy from the power grid 702 and store all of the energy being created by power source 701 as mechanical energy in the storage tank 707. Then, when energy prices from the power grid 702 are high, the system 700 can use energy created by the power source 701 to power the data center 720, and any excess energy created by the power source 701 can be sold back to the power grid 702 at the high price. In other embodiments, when the prices for electricity from the power grid 702 are high, the data center 720 can be powered by the energy stored in the storage tank 707 (as will be described in greater detail below), and all of the energy created by the power source 701 can be sold back to the power grid 702 at the high price.

One having skill in the art will understand that the data center 720 can be powered by any combination of energy from the power source 701, energy from the power grid 702, or energy from the storage tank 707. The embodiments above are non-limiting examples of how the system 700 can be operated advantageously according to energy prices from the power grid 702. One having skill in the art will understand that this disclosure includes other advantageous operations of the system 700 based on the price of electrical energy provided by the power grid 702.

Although FIGS. 7 and 8 illustrate examples for a charging mode process 800 of the system 700, various changes may be made to FIGS. 7 and 8. For example, in some embodiments, the system 700 does not include a power source 701. In these embodiments, the system 700 may receive electrical energy from the power grid 702. In these and other embodiments, the electrical energy supplied to the system 700 may be a constant, i.e., not intermittent, and the system 700 may be operated based on factors other than the presence or absence of power being produced by a power source. As discussed in further detail below, the system 700 can be operated according to a number of different factors, such as a price of electrical energy from the power grid 702.

In areas where electrical utility power is available, e.g., from the power grid 702, the system 700 can be used to provide a variety of ancillary services for the power grid 702. During peak times, the liquified air storage can be used to provide services including, but not limited to, additional power through the net metering device, voltage regulation, frequency regulation, or other load-resource applications to the power grid 702. Thus, the system 700 provides useful services to the power grid 702, for example, when needed or advantageous to the utility service provider. As further strain is encountered by energy grids, efficient methods of energy production are required to offset increased demands, which can be dispatched via the system 700 at reduced or minimal lead times.

Figure 9:
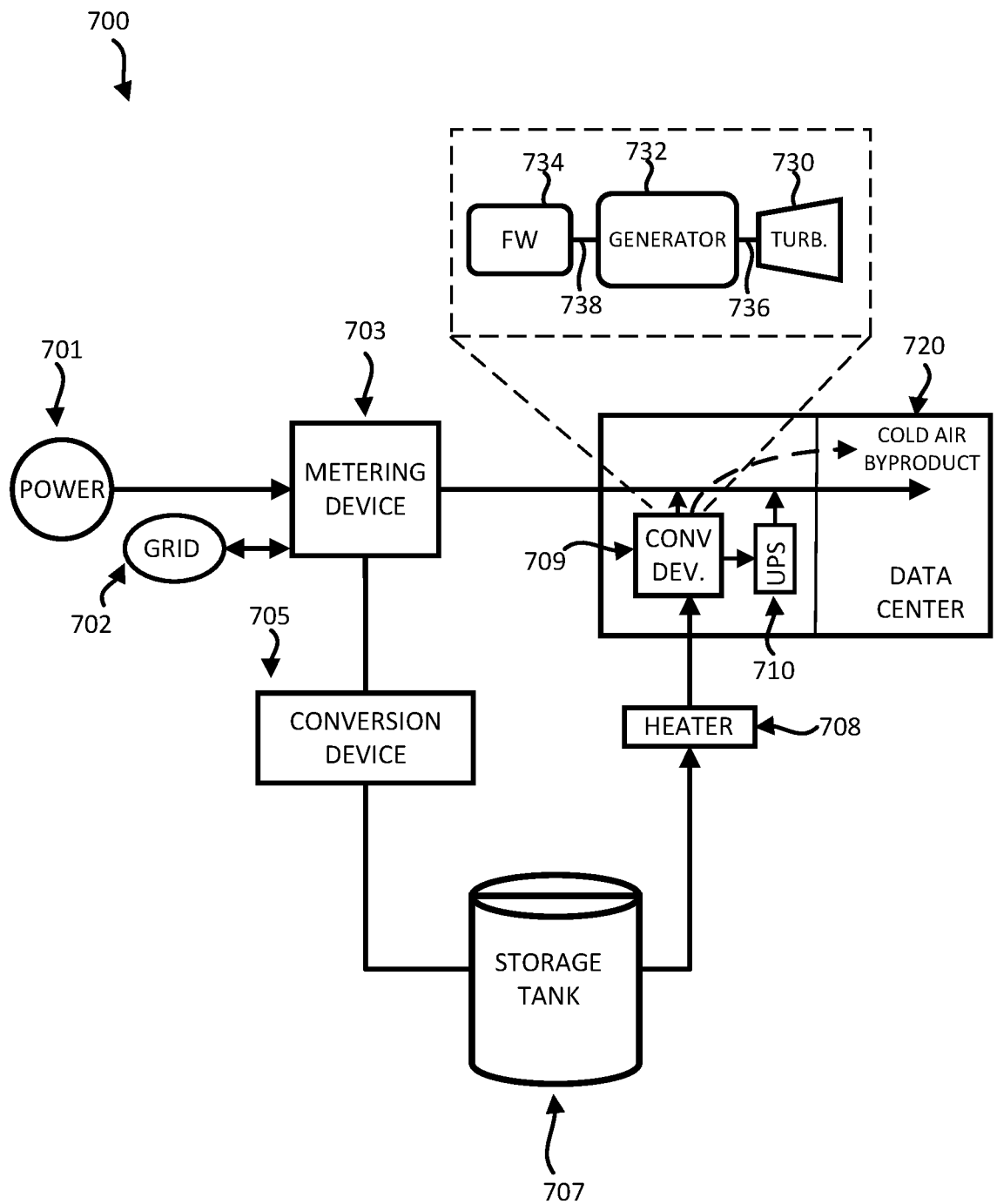
FIG. 9 illustrates another example of a power supply and cooling system in a discharging mode process according to various embodiments of the present disclosure.
Figure 10:
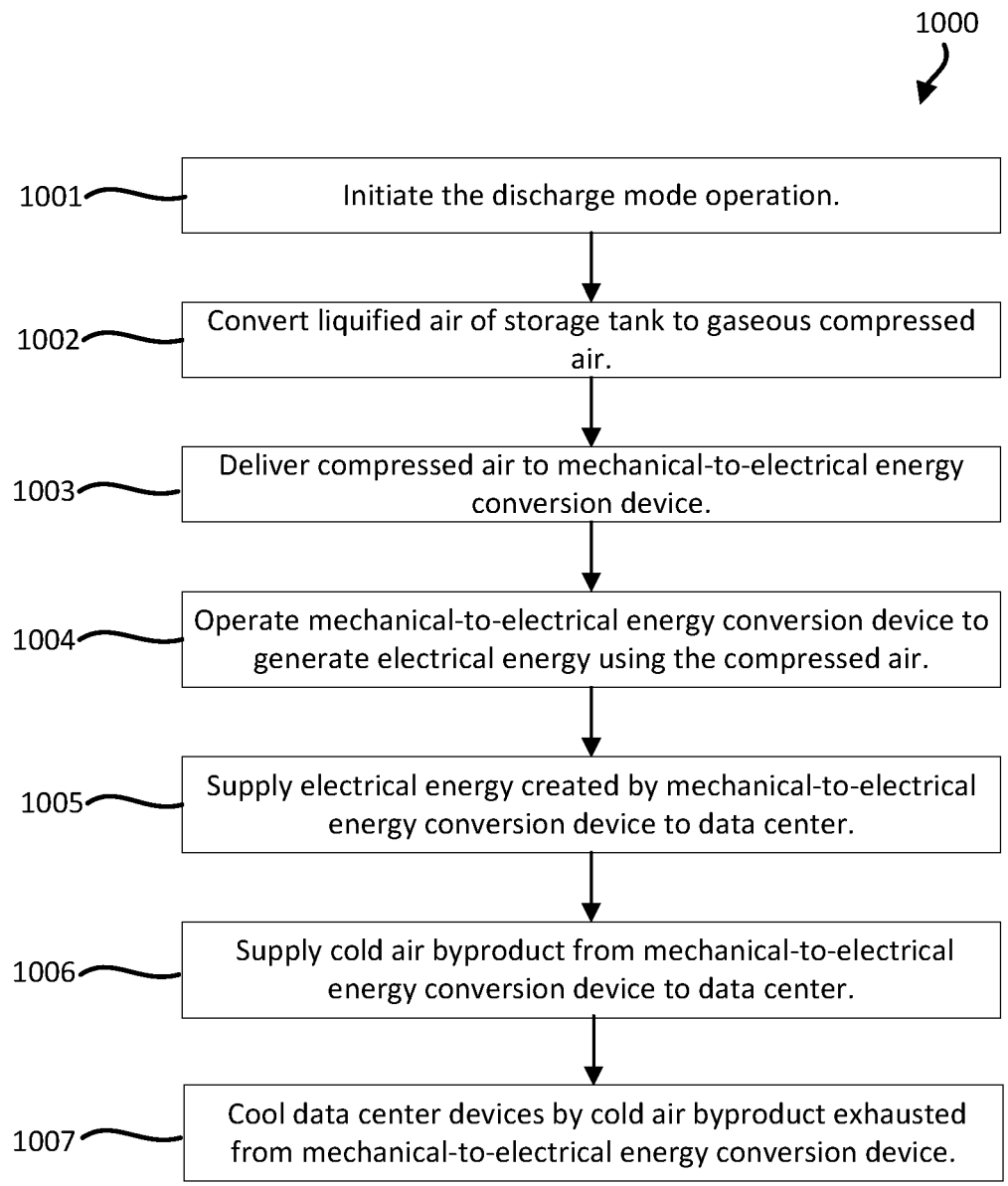
FIG. 10 is a flowchart illustrating another example of a discharging mode process of a power supply and cooling system according to various embodiments of the present disclosure.

FIG. 9 illustrates an example of the power supply and cooling system 700 in a discharging mode process 1000 according to various embodiments of the present disclosure. The discharging mode process 1000 may also be referred to as a gasification process, as the discharging mode process 1000 includes converting liquified air back to a gaseous state. The embodiment of the power supply and cooling system 700 shown in FIG. 9 is for illustration only. Other embodiments of the system 700 could be used without departing from the scope of this disclosure. FIG. 10 shows a flowchart illustrating an example of the discharging mode process 1000 of the power supply and cooling system 700 according to various embodiments of the present disclosure. The embodiment of the discharging mode process 1000 shown in FIG. 10 is for illustration only. Other embodiments of the discharging mode process 1000 could be used without departing from the scope of this disclosure.

FIG. 9 illustrates that, in the discharging mode process 1000, the power source 701 produces electrical energy and provides the energy to the metering device 703. The metering device 703, as discussed above, can direct electrical energy from the power source 701 and the power grid 702 to the data center 720 to be used by electronic devices housed in the data center 720, as previously discussed. While FIG. 9 illustrates that power is delivered to the data center 720 from the metering device 703, one having skill in the art will recognize that the system 700 may perform the discharging mode process 1000 without being provided electrical energy from the power source 701 or the power grid 702. During the discharging mode process 1000, the data center 720 may only be supplied with electrical energy produced from the mechanical energy stored in the storage tank 707. The process of providing electrical energy to the data center 720 from the mechanical energy stored in storage tank 707 will be discussed in greater detail below.

Referring to FIGS. 9 and 10, during the discharging mode process 1000, in operation 1001, the system 700 determines that the discharging mode process 1000 is to be initiated. As will be discussed in greater detail below, the determination made in operation 1001 may be made by a computing device of the system 700. As will be discussed in greater detail below, the system 700 may determine when to initiate the discharging mode process 1000 based on a number of different factors that result in advantageous scenarios for performing the discharging mode process 1000.

In operation 1002, the liquified air stored in the storage tank 707 is converted back to a gaseous state. The heater 708 may be used to heat the liquified air to convert (e.g., boil) the liquified air back to a gaseous state. The heater 708 may be the heater 608 described in FIG. 6. In various embodiments the heater 708 may not be required for the gasification of the liquified air stored in the storage tank 707. For example, liquified air may be stored in the storage tank 707 below the temperature at which liquified air converts to its gaseous state (approximately −320 degrees Fahrenheit at atmospheric pressure). The atmospheric heat converts liquified air to a gaseous state. In this example, the heater 708 is configured to accelerate the conversion of liquified gas to from a liquid to a gas. The gasification of the liquified air results in an increase in pressure. Accordingly, the air leaving the heater 708 and can be described as compressed air. As discussed above, the heater 708 may heat the liquified air using heat produced by the data center 720. In another example, the heat supplied by the heater 708 may be excess heat produced in the data center 720. Accordingly, the heater 708 may comprise one or more heat exchangers to transfer heat produced in the data center 720 to heat the liquified air to convert the liquified air back to a gaseous state.

In operation 1003, the compressed air is delivered to a mechanical-to-electrical energy conversion device 709. The mechanical-to-electrical energy conversion device 709 may be the mechanical-to-electrical energy conversion device 609 described in FIG. 6 above. As shown in FIG. 9, the mechanical-to-electrical energy conversion device 709 includes a turbine 730, a generator or alternator 732 (herein referred to as simply "generator"), and a flywheel 734. In various embodiments, the rotor of the generator 732 may be coupled to a spinning shaft 736 of the turbine 730 to generate electrical energy. In various embodiments, the shaft 736 of the turbine 730 may also be coupled to the flywheel 734, such that the turbine 730, the generator 732, and the flywheel 734 are on a common shaft or axis (736 and 738). In some embodiments, the turbine 730, the generator 732, the flywheel 734, and the shaft(s) 736, 738 can be oriented along a horizontal axis. However, this disclosure is not limited to horizontal arrangements. For example, in some embodiments, one or more of these components, including the flywheel 734 and the shaft(s) 736, 738, can be oriented vertically.

In operation 1004, the mechanical-to-electrical energy conversion device 709 may create electrical energy using the compressed air. Accordingly, an air line may connect the heater 708 and the mechanical-to-electrical energy conversion device 709 to deliver compressed air from the storage tank 707 to the mechanical-to-electrical energy conversion device 709. The mechanical-to-electrical energy conversion device 709 may then be operated by the supplied compressed air to create electrical energy. For example, the compressed air may be supplied to the turbine 730. The turbine 730 is powered by the compressed air to spin the shaft 736 coupled with the generator 732. The generator 732 is configured to convert the mechanical energy created by the turbine 730 into electrical energy.

In addition, the spinning shaft 736 of the turbine 730 may spin the shaft 738 of the flywheel 734. The mechanical energy supplied to the turbine 730 can be stored in the momentum of the spinning flywheel 734. In some embodiments, small amounts of electrical energy or small amounts of compressed air can keep the turbine 730, the generator 732, and the flywheel 734 spinning. Accordingly, if the turbine 730 ever ceases to provide mechanical energy to the generator 732, the mechanical energy stored in the momentum of the spinning flywheel 734 can be used to power the data center 720 and/or the generator 732 so that the generator 732 can continue to generate electrical energy even when the turbine 730 is not in operation or is operating at reduced speed, for example, during start up or switch over. That is, the flywheel 734 keeps the common shaft 736, 738 spinning long enough to have the air valve open and the turbine 730 once again provide the power to rotate the common shaft 736, 738. Additionally or alternatively, in some embodiments, the system 700 can include a belted or geared electric motor (not shown) that can rotate the common shaft 736, 738 during non-production periods.

In operation 1005, the electrical energy generated by the mechanical-to-electrical energy conversion device 709 may be supplied to the data center 720 to power the electrical devices of the data center 720. A byproduct of the electrical energy generation of the mechanical-to-electrical energy conversion device 709 is cold air. In operation 1006, the cold air byproduct of the mechanical-to-electrical energy conversion device 709 can be supplied to a heat source in the data center 720. For example, the data center 720 may house computer systems and other associated electronic devices. The computer systems and electronic devices of the data center can be powered by the mechanical-to-electrical energy conversion device 709, as previously discussed. While operating, the computer systems and electronic devices of the data center 720 may generate a substantial amount of heat and may need to be cooled to ensure proper operation of the computer systems. In operation 1007, while being powered by electrical energy created by the mechanical-to-electrical energy conversion device 709 in operation 1005, the computer systems and electronic devices of the data center 720 may be cooled by the cold air byproduct exhausted by the mechanical-to-electrical energy conversion device 709. In this way, the mechanical-to-electrical energy conversion device 709 both powers and cools the computer systems and electronic devices of the data center 720.

As described in detail above, the discharging mode process 1000 may be utilized in various scenarios. As previously described, in certain scenarios it may be advantageous for the system 700 to sell energy back to the power grid 702 based on the price of energy from the grid. For example, when energy prices from the power grid 702 are high, it may be advantageous to sell the electrical energy created by power source 701 to the power grid 702. When energy is being sold from the power source 701 to the power grid 702, power may be created by the discharging mode process 1000 as described above to supply power to the data center 720.

Additionally, the discharging mode process 1000 may be used in situations in which the power source 701 is not producing an amount of electrical energy adequate for powering the electrical load of the data center 720. For example, the discharging mode process 1000 may be performed to create electrical energy for the data center 720 at night when the power source 701 is a solar farm. As another example, the discharging mode process 1000 may be performed to provide the data center 720 with electrical energy on days when there is not enough wind to power a windfarm power source. The scenarios above are only listed as examples of when a discharging mode process 1000 can be performed. One having skill in the art will recognize that there are other scenarios in which it may be advantageous for the system 700 to perform the discharging mode process 1000 to provide the data center 720 with electrical energy from mechanical energy stored by the system 700.

As illustrated in in FIG. 9, the system 700 may include an uninterruptible power supply 710. Uninterruptible power supplies are used to provide power to a load when a main source of power fails. For example, uninterruptible power supplies can provide power to a load from a battery source. Uninterruptible power supplies may supply near-instantaneous protection from input power interruptions. Accordingly, uninterruptible power supplies may be configured to provide power to a load within a certain amount of time after detecting that a main power source has failed in providing power to the load. As previously discussed, the storage tank 707 containing mechanical energy can be considered a mechanical battery. Accordingly, the uninterruptible power supply 710 can be configured to treat the storage tank 707 and the mechanical-to-electrical energy conversion device 709 as a mechanical battery from which it supplies electrical energy to the data center 720 when a main source of power from the power grid 702 and/or the power source 701 fails. Accordingly, the uninterruptible power supply 710 may initiate the discharging mode process 1000 in order to supply the data center 720 with electrical energy in response to detecting that the power grid 702 and/or the power source 701 fails to provide power to the data center 720.

Figure 11:
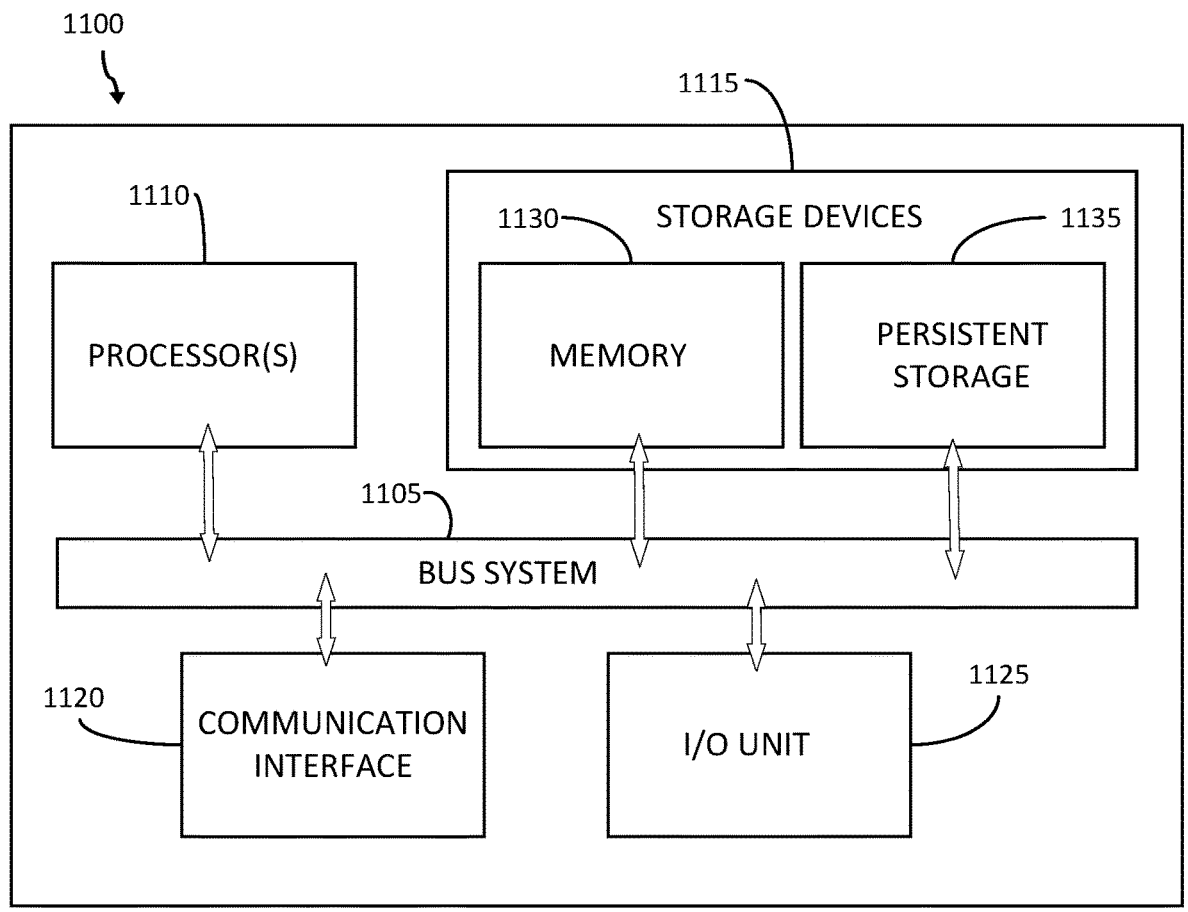
FIG. 11 illustrates an example of a computing device for use in a power supply and cooling system according to various embodiments of the present disclosure.

FIG. 11 illustrates an example of a computing device 1100 for use in a power supply and cooling system according to various embodiments of the present disclosure. In some embodiments, the computing device 1100 may be the computing device 104 of FIG. 1 or the computing device 604 of FIG. 6.

In some embodiments, the computing device 1100 may be configured to control the charging mode process 300 and the discharging mode process 500 of the system 200. The computing device 1100 may be programmed to control the system 200 based on a number of different factors already discussed. For example, in performing the charging and discharging mode processes 300, 500, the computing device 1100 may consider the price of electrical energy from the associated power grid 202, the amount of energy produced by the power source 201, the amount of mechanical energy stored in the storage container 207, and whether the power grid 202 and/or power source 201 unexpectedly fail to provide electrical energy to the data center 220. One having skill in the art will recognize that the computing device 1100 may operate the charging and discharging mode processes 300, 500 based on factors related to the system 200 not explicitly listed above.

The computing device 1100 may be configured to control the different components of the system 200. For example, the computing device 1100 may control operations associated with the power source 201. The computing device 1100 may control the operation of the metering device 203. For example, the computing device 1100 may control how the metering device 203 distributes electrical energy provided to the power source 201 and the power grid 202. The computing device 1100 may be configured to control the metering device 203 to distribute electrical energy from either the power grid 202 or the power source 201 to the data center 220 or the compressor 205 and the compressor motor 206 based on any of the factors discussed above, such as the availability of the renewable energy powering the power source 201, the price of electricity from the power grid 202, the amount of potential mechanical energy stored in the storage container 207, operability of the mechanical-to-electrical energy conversion device 209, if a power failure is detected, or any other factors that may related to the operation and efficiency of system 200.

The computing device 1100 may control the operation of the compressor 205 and the compressor motor 206. For example, the computing device 1100 may control whether the compressor 205 and the compressor motor 206 are turned off or on. The computing device 1100 may control compressed air pressure settings at which the compressor 205 outputs compressed air.

The computing device 1100 may control operations of the storage container 207. For example, the computing device 1100 may control valves associated with the storage container 207 to allow compressed air into the storage container 207 or release compressed air from the storage container 207. The computing device 1100 may also read sensor readings related to the storage container 207. For example, the computing device 1100 may determine pressures of the storage container 207 from pressure sensors associated with the storage container 207.

The computing device 1100 may be configured to control the heater 208. For example, the computing device 1100 may control whether the heater 208 is turned off or on. The computing device 1100 may control an amount of heat output from the heater 208. When the heater 208 is a recuperator, the computing device 1100 may control the recuperator in recovering heat from the compressor 205 or any other heat sources within or outside the system 200.

The computing device 1100 may control the mechanical-to-electrical energy conversion device 209. For example, the computing device 1100 may control whether the mechanical-to-electrical energy conversion device 209 is turned off or on. The computing device 1100 may control an amount of electrical energy output from the mechanical-to-electrical energy conversion device 209. The computing device 1100 be connected to the uninterruptible power supply 210. Accordingly, the computing device 1100 may take actions to control the system 200 in response to the uninterruptible power supply 210 detecting a power failure to the data center 220. The computing device 1100 may be operatively connected to the data center 220. The computing device 1100 may control the system 200 based on detected power needs of the data center 220.

The computing device 1100 may be configured to control the charging mode process 800 and discharging mode process 1000 of the system 700. The computing device 1100 may be programmed to control the system 700 based on a number of different factors already discussed. For example, in performing the charging and discharging mode processes 800, 1000, the computing device 1100 may consider the price of electrical energy from the associated power grid 702, the amount of energy produced by the power source 701, the amount of mechanical energy stored in the storage tank 707, and whether the power grid 702 and/or power source 701 unexpectedly fail to provide electrical energy to the data center 720. One having skill in the art will recognize that the computing device 1100 may operate the charging and discharging mode processes 800, 1000 based on factors related to the system 700 not explicitly listed above.

The computing device 1100 may be configured to control the different components of the system 700. For example, the computing device 1100 may control operations associated with the power source 701. The computing device 1100 may control the operation of the metering device 703. For example, the computing device 1100 may control how the metering device 703 distributes electrical energy provided to the power source 701 and the power grid 702. The computing device 1100 may be configured to control the metering device 703 to distribute electrical energy from either the power grid 702 or the power source 701 to the data center 720 or the gas-to-liquid conversion device 705 based on any of the factors discussed above, such as the availability of the renewable energy powering the power source 701, the price of electricity from the power grid 702, the amount of potential mechanical energy stored in the storage tank 707, operability of mechanical-to-electrical energy conversion device 709, if a power failure is detected, or any other factors that may related to the operation and efficiency of the system 700.

The computing device 1100 may control the operation of the gas-to-liquid conversion device 705. For example, the computing device 1100 may control whether the gas-to-liquid conversion device 705 is in operation. The computing device 1100 may control components of the of the gas-to-liquid conversion device 705 such a compressors, coolers, heat exchangers, separators, and any other controllable component of the gas-to-liquid conversion device 705.

The computing device 1100 may control operations of the storage tank 707. For example, the computing device 1100 may control valves associated with the storage tank 707 to allow liquified air into the storage tank 707 or release liquified air from the storage tank 707. The computing device 1100 may also read sensor readings related to the storage tank 707. For example, the computing device 1100 may determine pressures and temperatures of the storage tank 707 from pressure and temperature sensors associated with the storage tank 707. The computing device 1100 may determine a volume of liquid stored in the storage tank 707 using liquid level sensors associated with the storage tank 707.

The computing device 1100 may be configured to control the heater 708. For example, the computing device 1100 may control whether the heater 708 is turned off or on. The computing device 1100 may control an amount of heat output from the heater 708. When the heater 708 uses heat generated by the data center 720, the computing device 1100 may control how and when the heat is transferred from the data center 720 to the heater 708.

The computing device 1100 may control the mechanical-to-electrical energy conversion device 709. For example, the computing device 1100 may control whether the mechanical-to-electrical energy conversion device 709 is turned off or on. The computing device 1100 may control an amount of electrical energy output from the mechanical-to-electrical energy conversion device 709. The computing device 1100 be connected to the uninterruptible power supply 710. Accordingly, the computing device 1100 may take actions to control the system 700 in response to the uninterruptible power supply 710 detecting a power failure to data center 720. The computing device 1100 may be operatively connected to the data center 720. The computing device 1100 may control the system 700 based on detected power needs of the data center 720.

As shown in FIG. 11, the computing device 1100 includes a bus system 1105, which supports communication between processor(s) 1110, storage devices 1115, communication interface (or circuit) 1120, and input/output (I/O) unit 1125. The processor(s) 1110 executes instructions that may be loaded into a memory 1130. The processor(s) 1110 may include any suitable number(s) and type(s) of processors or other devices in any suitable arrangement. Example types of processor(s) 1110 include microprocessors, microcontrollers, digital signal processors, field programmable gate arrays, application specific integrated circuits, and discrete circuitry.

The memory 1130 and a persistent storage 1135 are examples of storage devices 1115, which represent any structure(s) capable of storing and facilitating retrieval of information (such as data, program code, and/or other suitable information on a temporary or permanent basis). The memory 1130 may represent a random access memory or any other suitable volatile or non-volatile storage device(s). The persistent storage 1135 may contain one or more components or devices supporting longer-term storage of data, such as a read-only memory, hard drive, Flash memory, or optical disc. For example, the persistent storage 1135 may store one or more databases of data, standards data, results data, client applications, etc.

The communication interface 1120 supports communications with other systems or devices. For example, the communication interface 1120 could include a network interface card or a wireless transceiver facilitating communications over any of the systems 100, 200, 600, 700. The communication interface 1120 may support communications through any suitable physical or wireless communication link(s). The I/O unit 1125 allows for input and output of data. For example, the I/O unit 1125 may provide a connection for user input through a keyboard, mouse, keypad, touchscreen, or other suitable input devices. The I/O unit 1125 may also send output to a display, printer, or other suitable output devices.

Although FIG. 11 illustrates one example of a computing device 1100, various changes may be made to FIG. 11. For example, various components in FIG. 11 could be combined, further subdivided, or omitted and additional components could be added according to particular needs. As a particular example, while depicted as one device, the computing device 1100 may include multiple computing devices or computing systems that may be remotely located. In another example, different computing systems may provide some or all of the processing, storage, and/or communication resources for providing improvement recommendations in accordance with various embodiments of the present disclosure.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "such as," when used among terms, means that the latter recited term(s) is(are) example(s) and not limitation(s) of the earlier recited term. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described herein can be implemented or supported by one or more computer programs, each of which is formed from computer readable program code and embodied in a computer-readable medium. The terms "application" and "program" refer to one or more computer programs, software components, sets of instructions, procedures, functions, objects, classes, instances, related data, or a portion thereof adapted for implementation in a suitable computer readable program code. The phrase "computer-readable program code" includes any type of computer code, including source code, object code, and executable code. The phrase "computer-readable medium" includes any type of medium capable of being accessed by a computer, such as read-only memory (ROM), random access memory (RAM), a hard disk drive, a compact disc (CD), a digital video disc (DVD), or any other type of memory. A "non-transitory" computer-readable medium excludes wired, wireless, optical, or other communication links that transport transitory electrical or other signals. A non-transitory, computer-readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases. Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claim scope. The scope of the patented subject matter is defined by the claims.

What is claimed is:

1. A system for providing cooling and power, the system comprising:
   a meter configured to receive first electrical energy from a power source and provide at least a portion of the first electrical energy to a data center during a first time period, the data center comprising multiple electronic devices that generate heat while in operation;
   an electrical-to-mechanical energy conversion device configured to convert air at approximately atmospheric pressure to a compressed or liquified state using at least the portion of the first electrical energy received from the power source during the first time period;
   a storage container configured to receive the air from the electrical-to-mechanical energy conversion device and store the air in the compressed or liquified state;

a mechanical-to-electrical energy conversion device configured to, during a second time period in which the meter does not provide the first electrical energy to the data center:
receive the air from the storage container in a gaseous, compressed state;
generate second electrical energy for powering the data center using the air received from the storage container; and
exhaust cooled air for providing to the data center to cool the electronic devices; and
a heater configured to (i) receive thermal energy generated by the electrical-to-mechanical energy conversion device and (ii) use the thermal energy to heat the air from the storage container from the compressed or liquified state to the gaseous, compressed state before the air is supplied to the mechanical-to-electrical energy conversion device,
wherein the second time period comprises a period of time during which the first electrical energy from the power source is not cost efficient.

2. The system of claim 1, wherein the mechanical-to-electrical energy conversion device comprises a compressed-air powered flywheel, an alternator or generator, and a turboexpander or turbo generator configured to be pneumatically driven via the air in the gaseous, compressed state to generate the second electrical energy.

3. The system of claim 1, wherein the electrical-to-mechanical energy conversion device comprises a fluid compressor configured to receive the air at approximately atmospheric pressure and compress the air to the compressed state.

4. The system of claim 3, wherein the storage container comprises a geological structure configured to receive and store the air in the compressed state.

5. The system of claim 1, wherein:
the electrical-to-mechanical energy conversion device comprises a gas-to-liquid converter configured to receive the air at approximately atmospheric pressure and liquify the air to the liquified state; and
the storage container comprises an insulated, refrigerated storage tank configured to store the air in the liquified state.

6. The system of claim 1, wherein the power source comprises at least one of: one or more wind turbines, one or more wave turbines, and one or more solar panels.

7. A method comprising:
receiving first electrical energy from a power source at a meter and providing at least a portion of the first electrical energy to a data center during a first time period, the data center comprising multiple electronic devices that generate heat while in operation;
converting air at approximately atmospheric pressure to a compressed or liquified state using an electrical-to-mechanical energy conversion device using at least the portion of the first electrical energy received from the power source during the first time period;
receiving the air from the electrical-to-mechanical energy conversion device and storing the air in a storage container in the compressed or liquified state;
receiving the air from the storage container in a gaseous, compressed state at a mechanical-to-electrical energy conversion device;
using the air from the storage container at the mechanical-to-electrical energy conversion device to generate second electrical energy for powering the data center during a second time period in which the meter does not provide the first electrical energy to the data center;
exhausting cooled air from the mechanical-to-electrical energy conversion device for providing to the data center to cool the electronic devices; and
receiving thermal energy generated by the electrical-to-mechanical energy conversion device and using the thermal energy to heat the air from the storage container from the compressed or liquified state to the gaseous, compressed state before the air is supplied to the mechanical-to-electrical energy conversion device,
wherein the second time period comprises a period of time during which the first electrical energy from the power source is not cost efficient.

8. The method of claim 7, wherein the mechanical-to-electrical energy conversion device comprises a compressed-air powered flywheel, an alternator or generator, and a turboexpander or turbo generator configured to be pneumatically driven via the air in the gaseous, compressed state to generate the second electrical energy.

9. The method of claim 7, wherein the electrical-to-mechanical energy conversion device comprises a fluid compressor that receives the air at approximately atmospheric pressure and compresses the air to the compressed state.

10. The method of claim 9, wherein the storage container comprises a geological structure that receives and stores the air in the compressed state.

11. The method of claim 7, wherein:
the electrical-to-mechanical energy conversion device comprises a gas-to-liquid converter that receives the air at approximately atmospheric pressure and liquifies the air to the liquified state; and
the storage container comprises an insulated, refrigerated storage tank that stores the air in the liquified state.

12. The method of claim 7, wherein the power source comprises at least one of: one or more wind turbines, one or more wave turbines, and one or more solar panels.

13. A non-transitory computer readable medium embodying a computer program, the computer program comprising computer readable program code that, when executed by a processor of a computing device, cause the computing device to:
control a meter to provide first electrical energy, received from a power source, to a data center during a first time period, the data center comprising multiple electronic devices that generate heat while in operation;
control an electrical-to-mechanical energy conversion device to convert air at approximately atmospheric pressure to a compressed or liquified state using at least a portion of the first electrical energy received from the power source during the first time period and to transfer the air to a storage container for storage of the air in the compressed or liquified state;
control a mechanical-to-electrical energy conversion device to, during a second time period in which the meter does not provide the first electrical energy to the data center:
receive the air from the storage container in a gaseous, compressed state;
generate second electrical energy for powering the data center using the air received from the storage container; and
exhaust cooled air for providing to the data center to cool the electronic devices; and
control a heater to (i) receive thermal energy generated by the electrical-to-mechanical energy conversion device and (ii) use the thermal energy to heat the air from the storage container from the compressed or liquified state to the gaseous, compressed state before the air is supplied to the mechanical-to-electrical energy conversion device, wherein the second time period comprises a period of time during which the first electrical energy from the power source is not cost efficient.

14. The non-transitory computer readable medium of claim 13, wherein the mechanical-to-electrical energy conversion device comprises a compressed-air powered flywheel, an alternator or generator, and a turboexpander or turbo generator configured to be pneumatically driven via the air in the gaseous, compressed state to generate the second electrical energy.

15. The non-transitory computer readable medium of claim 13, wherein the electrical-to-mechanical energy conversion device comprises a fluid compressor that receives the air at approximately atmospheric pressure and compresses the air to the compressed state.

16. The non-transitory computer readable medium of claim 15, wherein the storage container comprises a geological structure that receives and stores the air in the compressed state.

17. The non-transitory computer readable medium of claim 13, wherein:
the electrical-to-mechanical energy conversion device comprises a gas-to-liquid converter that receives the air at approximately atmospheric pressure and liquifies the air to the liquified state; and
the storage container comprises an insulated, refrigerated storage tank that stores the air in the liquified state.

* * * * *